US008239604B1

United States Patent
Shimanek et al.

(10) Patent No.: US 8,239,604 B1
(45) Date of Patent: Aug. 7, 2012

(54) METHOD AND APPARATUS FOR CONVERTING DATA BETWEEN DIFFERENT WORD WIDTHS USING LINE GROUPING OF DATA SEGMENTS

(75) Inventors: Schuyler E. Shimanek, Albuquerque, NM (US); Joe E. Leyba, Albuquerque, NM (US); Wayne E. Wennekamp, Rio Rancho, NM (US)

(73) Assignee: Xilinx, Inc., San Jose, CA (US)

( * ) Notice: Subject to any disclaimer, the term of this patent is extended or adjusted under 35 U.S.C. 154(b) by 210 days.

(21) Appl. No.: 12/696,672

(22) Filed: Jan. 29, 2010

Related U.S. Application Data

(60) Provisional application No. 61/148,926, filed on Jan. 31, 2009, provisional application No. 61/148,927, filed on Jan. 31, 2009.

(51) Int. Cl.
*G06F 13/40* (2006.01)
(52) U.S. Cl. .................................................. 710/307
(58) Field of Classification Search .......... 710/300–315, 710/66
See application file for complete search history.

(56) References Cited

U.S. PATENT DOCUMENTS

| | | | |
|---|---|---|---|
| 5,113,369 A * | 5/1992 | Kinoshita .................. | 710/307 |
| 5,577,213 A * | 11/1996 | Avery et al. ............... | 710/100 |
| 5,613,078 A * | 3/1997 | Kishigami ................. | 710/307 |
| 5,651,138 A * | 7/1997 | Le et al. .................... | 711/154 |
| 5,768,546 A * | 6/1998 | Kwon ........................ | 710/307 |
| 5,911,053 A * | 6/1999 | Pawlowski et al. ........ | 710/307 |
| 6,047,347 A * | 4/2000 | Hansen et al. ............. | 710/307 |
| 6,262,933 B1 * | 7/2001 | Chang et al. ........... | 365/230.06 |
| 6,292,018 B1 * | 9/2001 | Kean ......................... | 326/41 |
| 6,370,603 B1 * | 4/2002 | Silverman et al. ........ | 710/72 |
| 7,043,592 B2 * | 5/2006 | Nagano ..................... | 710/307 |
| 7,542,324 B1 * | 6/2009 | Choe ......................... | 365/63 |
| 8,063,660 B1 * | 11/2011 | Strader et al. ............. | 326/40 |

OTHER PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.

(Continued)

*Primary Examiner* — Raymond Phan
(74) *Attorney, Agent, or Firm* — Murray Smith; Kevin T. Cuenot

(57) ABSTRACT

Some embodiments involve a circuit having first and second interfaces, and configurable structure to identify a selected integer number that is one of a plurality of different integer numbers associated with respective different configurations. In one embodiment, a conversion section organizes lines of the second interface into line groups equal in number to the selected integer number, and carries out a conversion operation in which it supplies to each line group a respective incoming data segment received through the first interface. In another embodiment, a conversion section organizes the lines of the first interface into line groups equal in number to the selected integer number, and carries out a conversion operation in which it supplies to the second interface a respective incoming data segment from each line group.

20 Claims, 19 Drawing Sheets

OTHER PUBLICATIONS

U.S. Appl. No. 12/693,397, filed Jan. 25, 2010, Wennekamp, et al., Xilinx, Inc., 2100 Logic Drive, San Jose, CA.

U.S. Appl. No. 12/692,771, filed Jan. 25, 2010, Flateau, Jr., et al., Xilinx, Inc., 2100 Logic Drive, San Jose, CA.

U.S. Appl. No. 12/690,856, filed Jan. 20, 2010, Elkins, et al., Xilinx, Inc., 2100 Logic Drive, San Jose, CA.

U.S. Appl. No. 12/695,341, filed Jan. 28, 2010, Strader, et al., Xilinx, Inc., 2100 Logic Drive, San Jose, CA.

U.S. Appl. No. 12/695,099, filed Jan. 27, 2010, Shimanek, et al., Xilinx, Inc., 2100 Logic Drive, San Jose, CA.

U.S. Appl. No. 12/694,656, filed Jan. 27, 2010, Elkins, et al., Xilinx, Inc., 2100 Logic Drive, San Jose, CA.

* cited by examiner

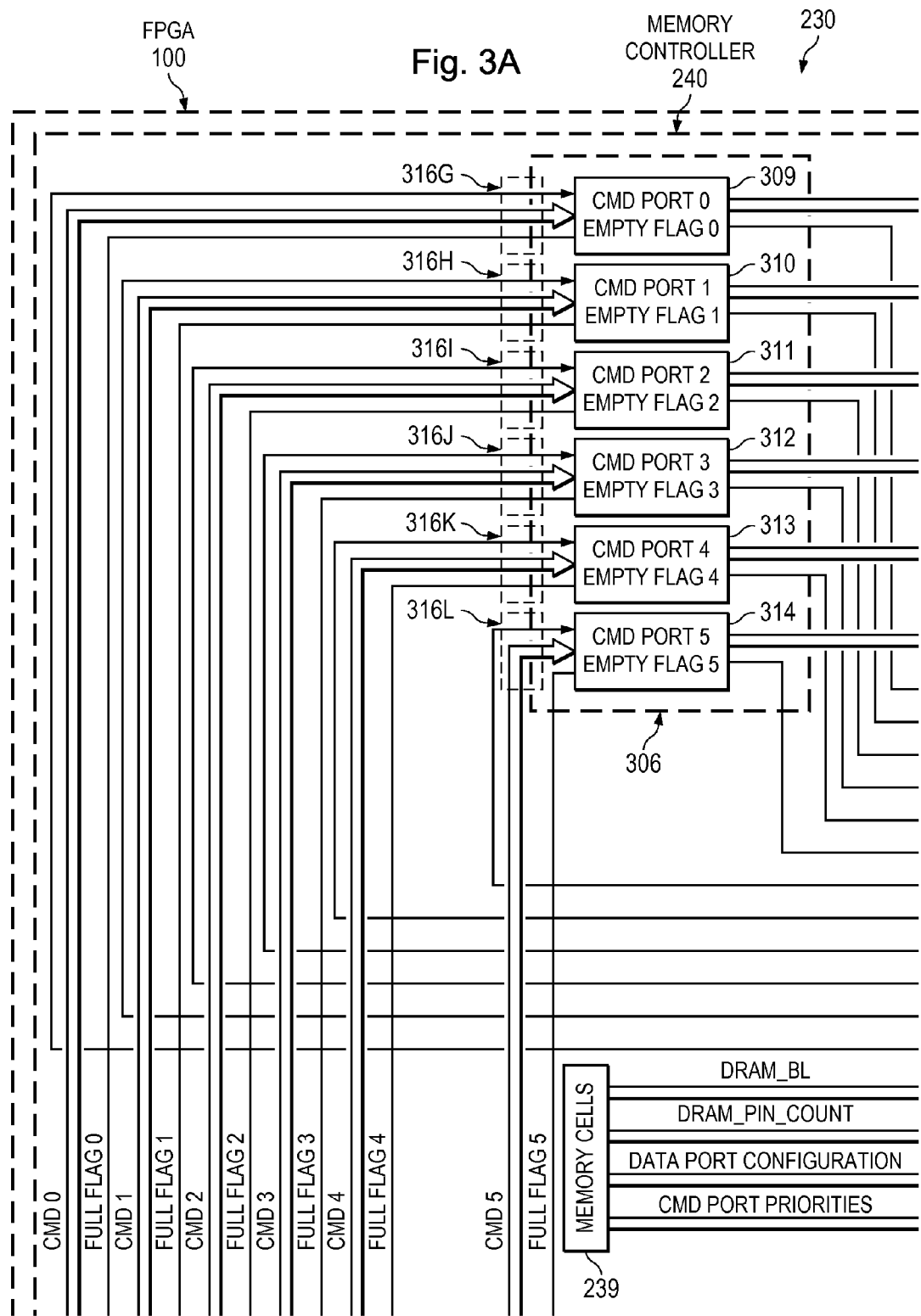

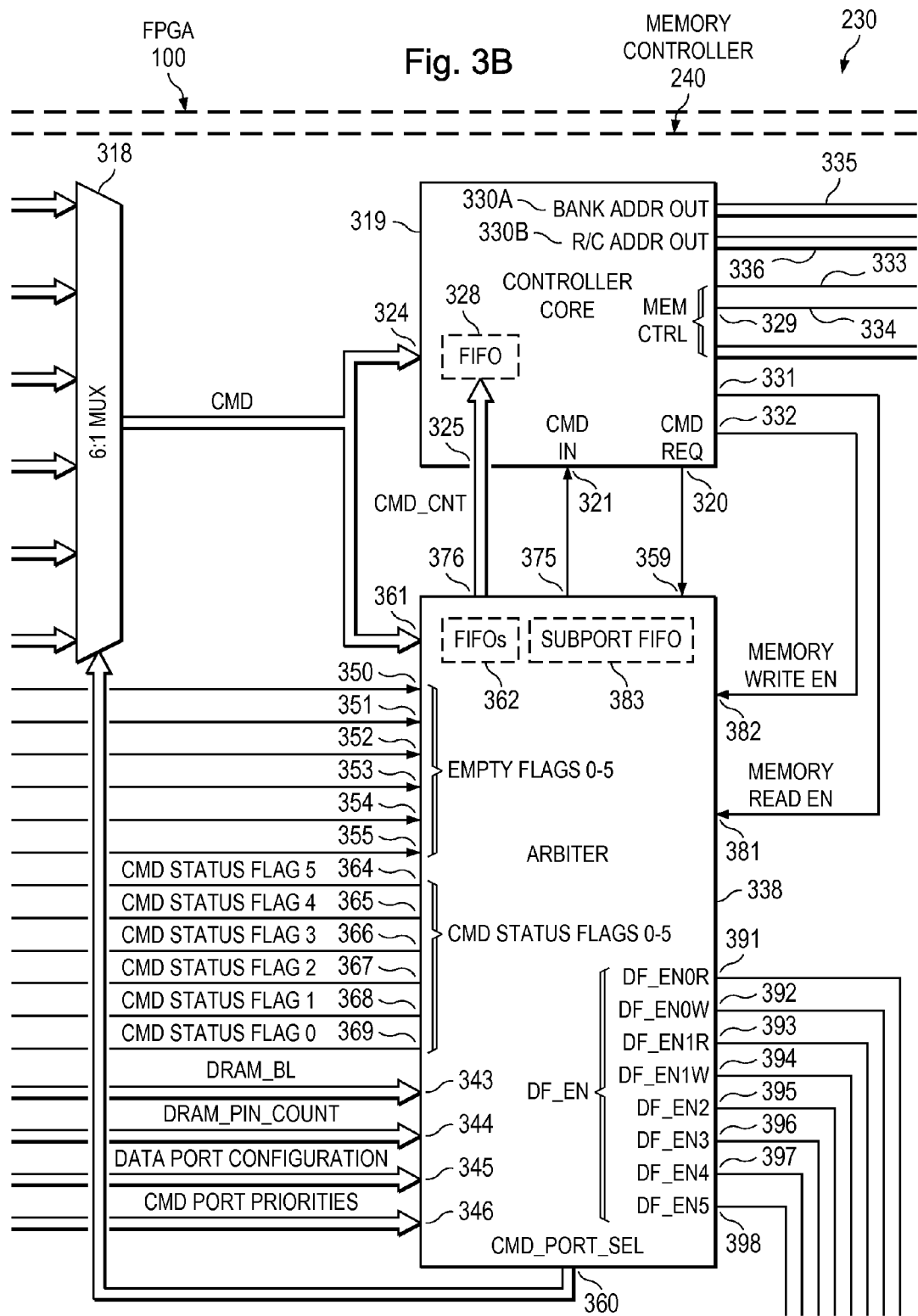

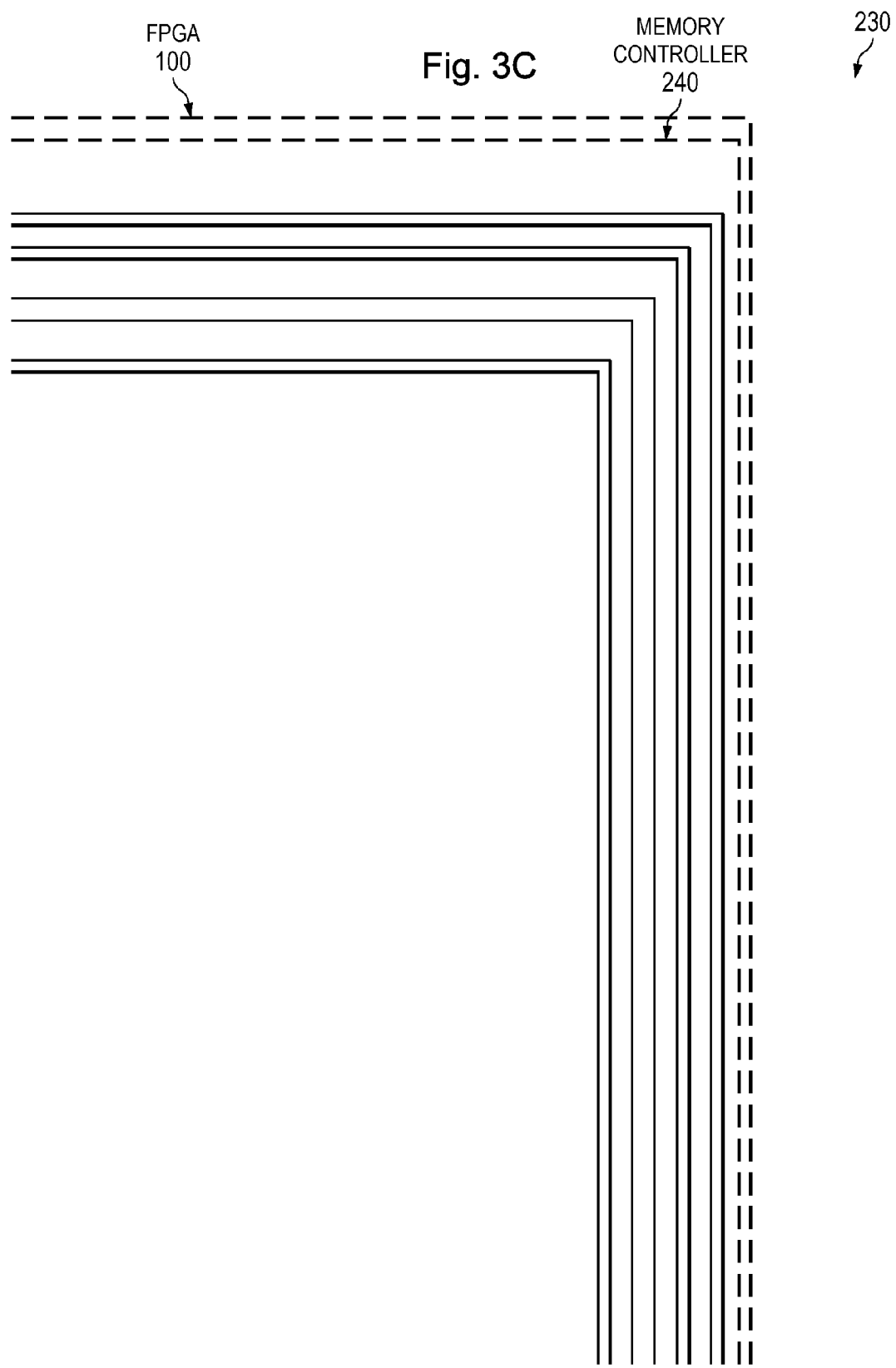

METHOD AND APPARATUS FOR CONVERTING DATA BETWEEN DIFFERENT WORD WIDTHS USING LINE GROUPING OF DATA SEGMENTS

CROSS-REFERENCE TO RELATED APPLICATIONS

This application claims the priority under 35 U.S.C. §119 of U.S. Provisional Patent Application No. 61/148,926 filed on Jan. 31, 2009 and entitled "Apparatus and Method for a Memory Controller", and also U.S. Provisional Patent Application No. 61/148,927 filed on Jan. 31, 2009 and entitled "Architecture for Advanced Integrated Circuit Providing Good Performance and Low Cost". The disclosures of both of these provisional patent applications are hereby incorporated herein by reference in their entirety.

FIELD OF THE INVENTION

An embodiment of the invention relates to techniques for interfacing different circuits. More particularly, an embodiment of the invention relates to techniques for converting data between different word widths.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs are sometimes field programmed to define a memory controller that can interface the PLD to an external memory device. Circuitry within the PLD may include a user application that utilizes a word width that is different from the word width of the memory. As data is transferred between the memory and the circuitry within the PLD, the data must be converted between the different word widths of the memory and the user application within the FPGA. A further consideration in this regard is that, because the memory is an external device, it could be any of a number of different memory devices that utilize various word widths. Although existing memory controllers programmed within PLDs have been generally adequate in regard to interfacing PLD circuitry to an external memory, they have not been entirely satisfactory in all respects.

SUMMARY OF THE INVENTION

One embodiment involves a circuit that includes configuration identification structure configurable to identify a selected one of a plurality of different configurations each having associated therewith a respective one of a plurality of different integer numbers that are each greater than zero, the integer number associated with the selected configuration being a selected integer number. The circuit further includes a first interface, a second interface, and a conversion section that is coupled to the first and second interfaces. The second interface includes a plurality of lines, the number of the lines being greater than or equal to the largest integer number in the plurality of integer numbers. The conversion section is responsive to the configuration identification structure, and organizes the lines of the second interface into line groups equal in number to the selected integer number, the conversion section carrying out a conversion operation in which it supplies to each line group a respective incoming data segment received through the first interface, wherein if the selected integer value is greater than one then the line groups are mutually exclusive and, during the conversion operation, a plurality of the incoming data segments equal in number to the selected number are successively received through the first interface and are successively supplied to the respective line groups.

A different embodiment involves a circuit that includes configuration identification structure configurable to identify a selected one of a plurality of different configurations each having associated therewith a respective one of a plurality of different integer numbers that are each greater than zero, the integer number associated with the selected configuration being a selected integer number. The circuit further includes first and second interfaces, and a conversion section that is coupled to the first and second interfaces. The first interface includes a plurality of lines, the number of the lines being greater than or equal to the largest integer number in the plurality of integer numbers. The conversion section is responsive to the configuration identification structure, and organizes the lines of the first interface into line groups equal in number to the selected integer number, the conversion section carrying out a conversion operation in which it supplies to the second interface a respective incoming data segment from each line group, wherein if the selected integer value is greater than one then the line groups are mutually exclusive and, during the conversion operation, the incoming data segments from the respective line groups are supplied successively to the second interface.

Another embodiment relates to a method involving a circuit having configuration identification structure, a first interface, and a second interface that includes a plurality of lines, the number of the lines being greater than or equal to the largest integer number in the plurality of integer numbers. The method includes: configuring the configuration identification structure to identify a selected one of a plurality of different configurations each having associated therewith a respective one of a plurality of different integer numbers that are each greater than zero, the integer number associated with the selected configuration being a selected integer number; organizing the lines of the second interface into line groups equal in number to the selected integer number; and carrying out a conversion operation in which each line group is supplied with a respective incoming data segment received through the first interface, wherein if the selected integer value is greater than one then the line groups are mutually exclusive and, during the conversion operation, a plurality of the incoming data segments equal in number to the selected number are successively received through the first interface and are successively supplied to the respective line groups.

Yet another embodiment relates to a method involving a circuit having configuration identification structure, having a first interface that includes a plurality of lines, the number of the lines being greater than or equal to the largest integer number in the plurality of integer numbers, and having a second interface. The method includes: configuring the configuration identification structure to identify a selected one of a plurality of different configurations each having associated therewith a respective one of a plurality of different integer numbers that are each greater than zero, the integer number associated with the selected configuration being a selected integer number; organizing the lines of the first interface into line groups equal in number to the selected integer number; and carrying out a conversion operation that includes supplying to the second interface a respective incoming data segment from each line group, wherein if the selected integer value is greater than one then the line groups are mutually exclusive and, during the conversion operation, the incoming data segments from the respective line groups are supplied successively to the second interface.

DETAILED DESCRIPTION

Figure 1:
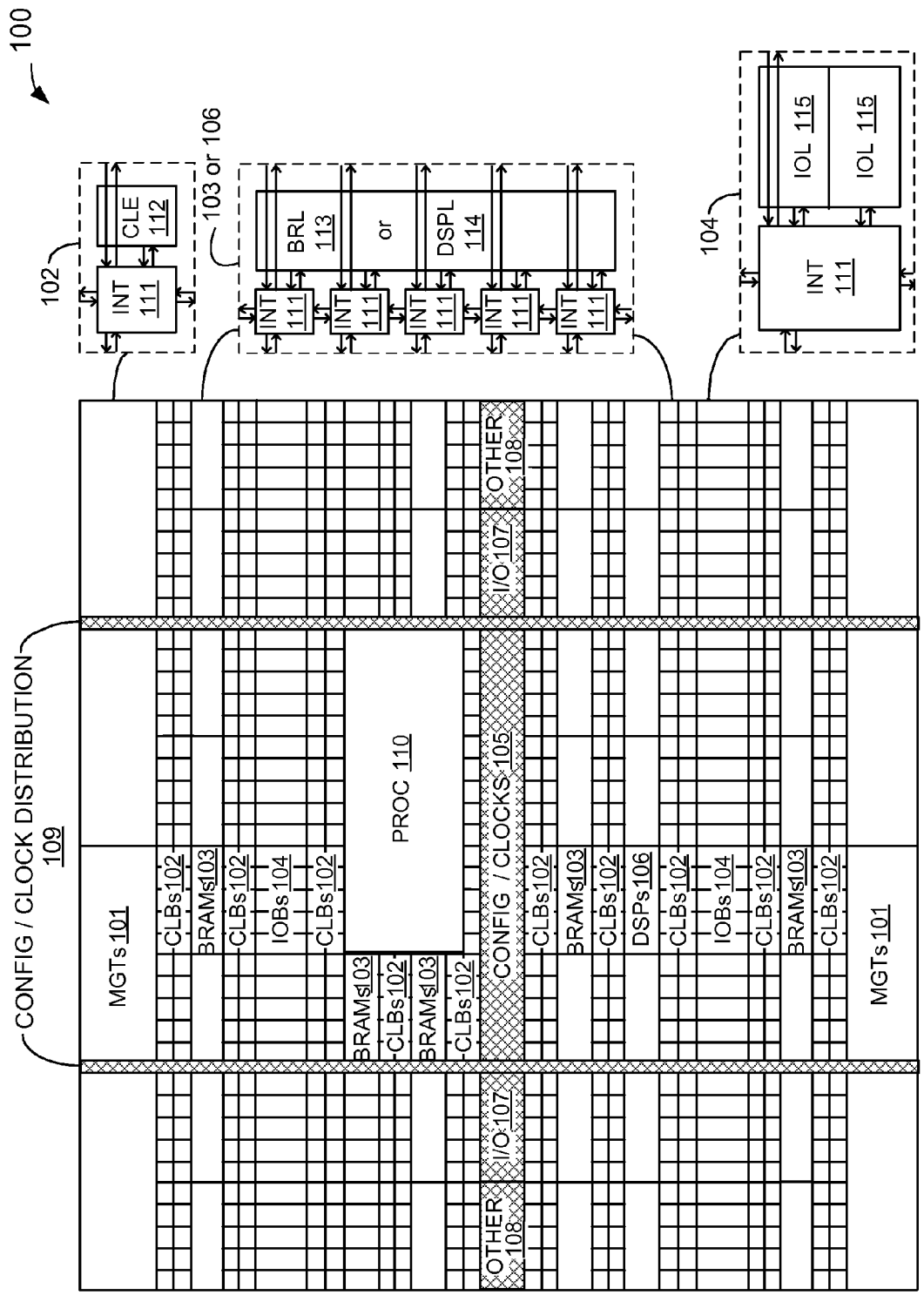
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
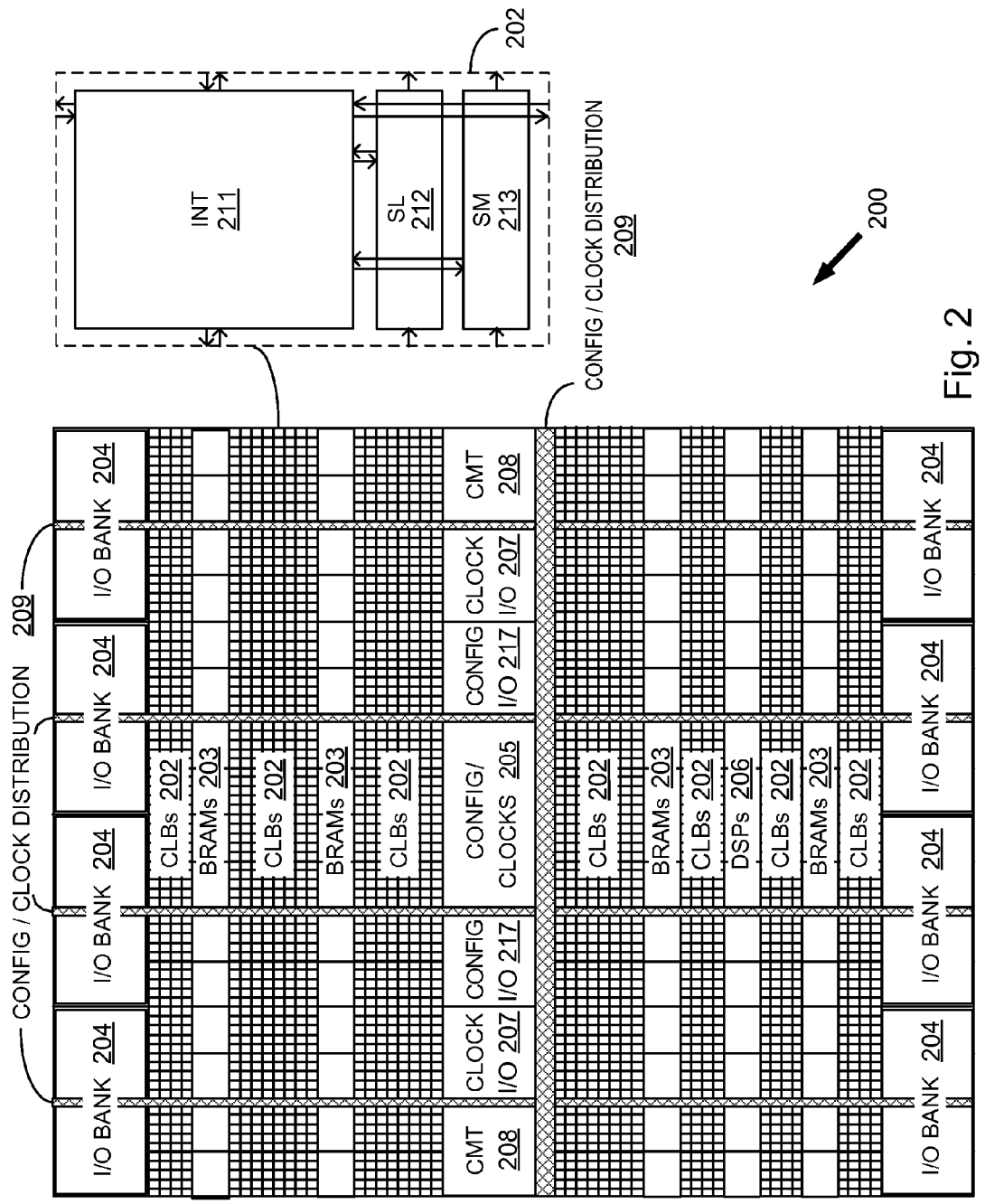
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
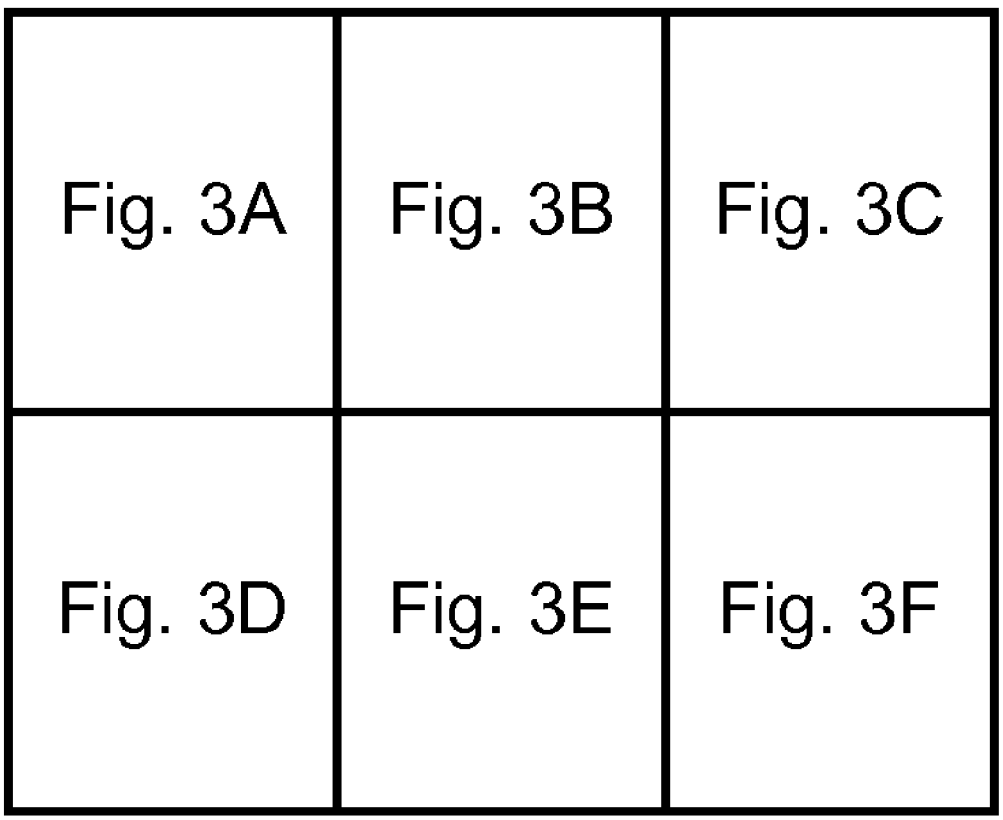
FIG. 3 (which includes FIGS. 3A-3F) is a block diagram showing an apparatus in the form of a circuit that includes the FPGA of FIG. 1 and a dynamic random access memory (DRAM), the FPGA including a memory controller circuit.
Figure 3D:
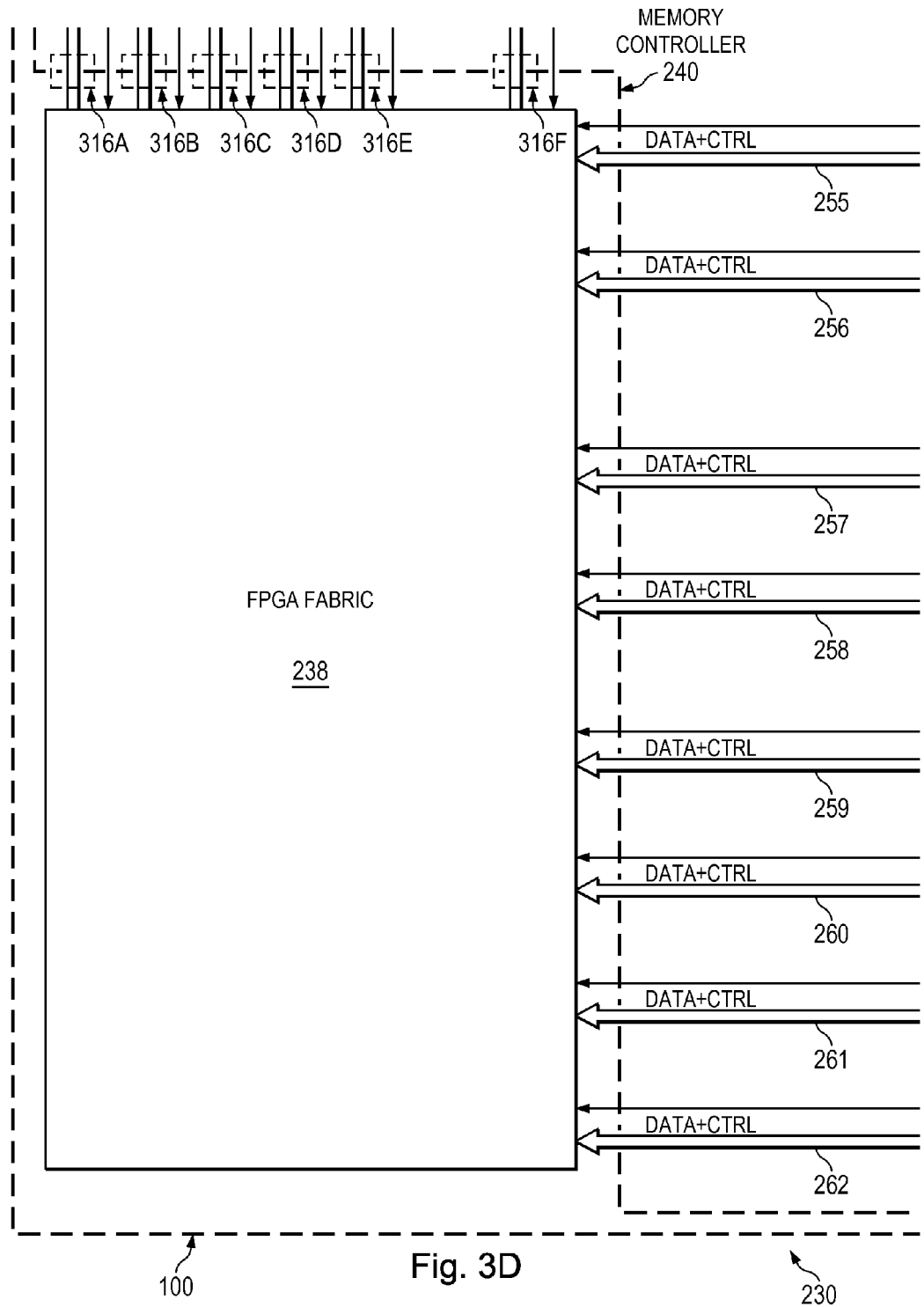
Figure 3E:
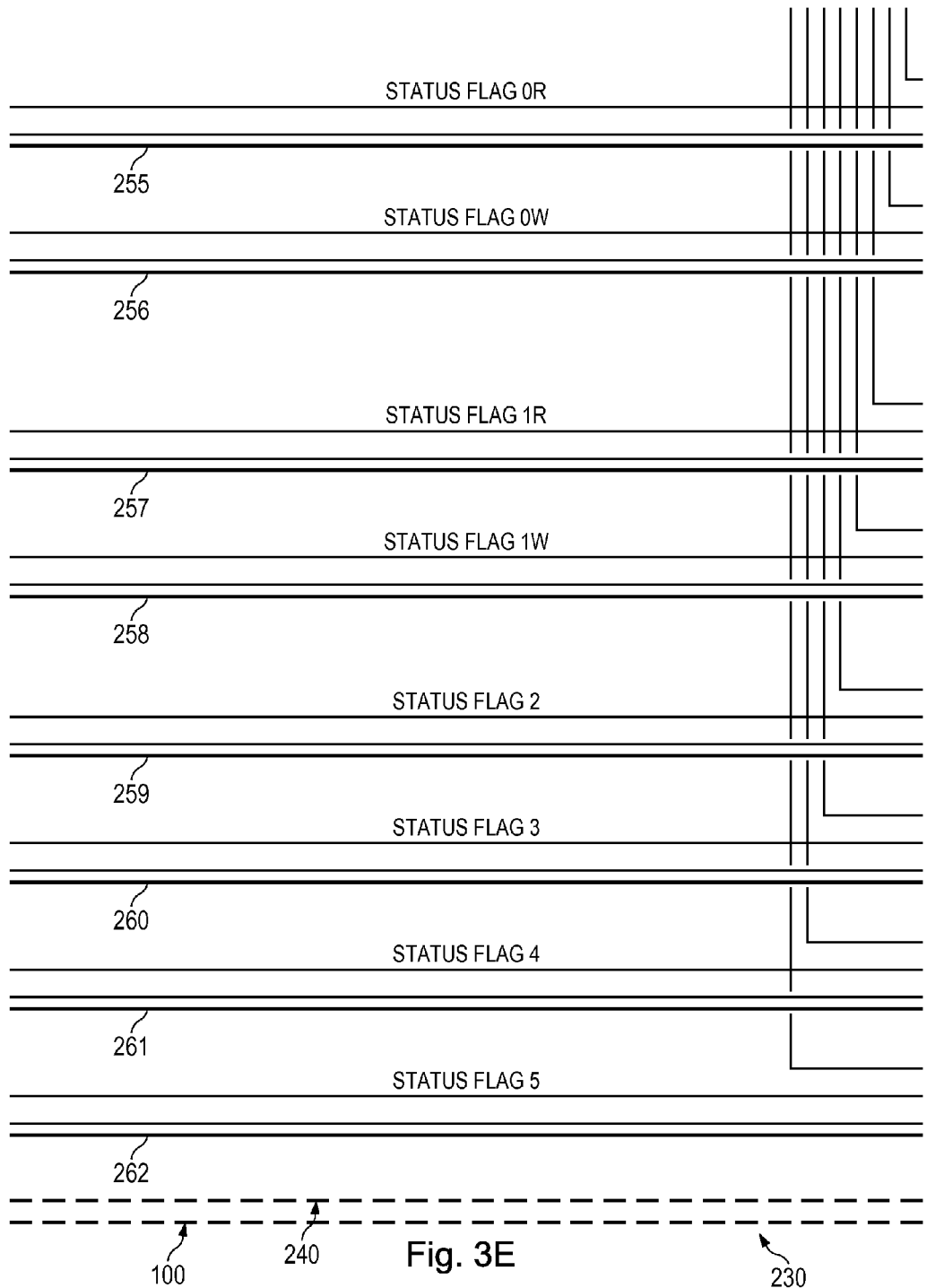
Figure 3F:
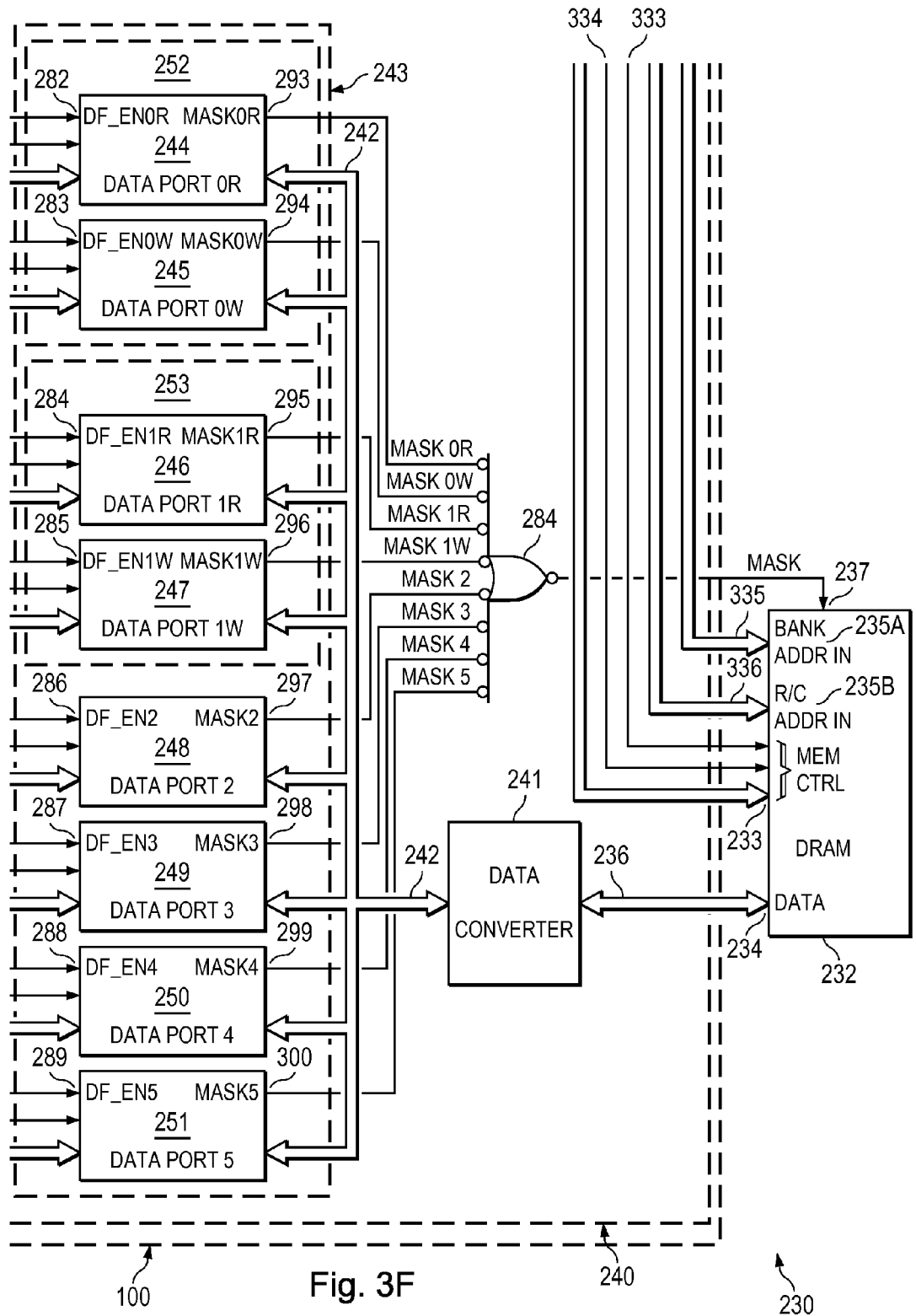

FIG. 3 (which includes FIGS. 3A-3F) is a block diagram showing an apparatus 230 in the form of a circuit that includes the FPGA 100 of FIG. 1, and a dynamic random access memory (DRAM) 232. The FPGA in FIG. 3 could alternatively be the FPGA 200 of FIG. 2. FIG. 3 does not show everything in the FPGA 100. Instead, FIG. 3 shows only portions of the FPGA that are relevant to an understanding of the disclosed embodiment of the invention.

The DRAM 232 is a standard double data rate (DDR) device with a standard memory interface. Alternatively, the DRAM 232 could be a memory of a different double data rate type (for example DDR2, DDR3, LPDDR, or mobile DDR). As another alternative, the DRAM 232 could be any of a variety of other memory devices. For example, the DRAM 232 could be a memory of the type known as single data rate (SDR). The memory interface of the DRAM 232 includes a memory control input 233 for receiving MEM CTRL signals, a data interface 234 for receiving and outputting data, and an address input ADDR 235 that receives a memory address. The data interface 234 is coupled to a data bus 236. The DRAM 232 also includes an input 237 for receiving a signal MASK. As discussed in more detail later, the signal MASK can be used during a memory write to advise the DRAM 232 not to write data into certain memory locations within the memory access.

The DRAM 232 has a DRAM PIN_COUNT that is an integer number representing the width of each memory location in the DRAM, and that is also the width of the data interface 234 of the DRAM 232. For purposes of the following discussion, it is assumed that the PIN_COUNT of the DRAM 232 is 8 bits. Alternatively, however, the DRAM PIN_COUNT could be 4 or 16 bits, or any other suitable number of bits. The DRAM 232 also has a memory burst length DRAM_BL that is the number of memory words accessed during each memory access carried out by the DRAM 232. For purposes of the following discussion, it is assumed that the DRAM_BL of the DRAM 232 is 8 words. Alternatively, however, the DRAM_BL could be 4 words, or any other suitable number of words. During each memory access, the DRAM 232 uses time slots equal in number to the DRAM_BL, where one 8-bit word or memory location can be accessed during each time slot. In other words, during each memory access, the DRAM 232 has 8 time slots during which it can read eight 8-bit words for a READ command, or write eight 8-bit words for a WRITE command. As a practical matter, during a WRITE command, less than 8 words may actually be written into the memory (as discussed in more detail later), but all 8 time slots still occur. During each memory access, the DRAM 232 can access up to eight 8-bit words, or 64 bits in total. Accordingly, to transfer more than 64 bits of data, a data transfer sequence involving an integer number of memory access cycles is needed, where the integer number is greater than or equal to 2.

The DRAM 232 is conceptually divided into a series of contiguous blocks that are each equal in size to the DRAM_BL and thus each have 64 bits, and that each have respective start and end memory address boundaries. READ and WRITE accesses each need to start and end on a boundary. In instances where either the start or end memory address of a READ operation does not coincide with a boundary, the system ignores certain portions of memory blocks that are accessed during a READ. In instances where either the start or end memory address of a WRITE operation does not coincide with a boundary, the signal MASK is used to tell the DRAM 232 to ignore selected memory locations that are not to be written during the memory access.

In more detail, there are four different data transfer scenarios with regard to memory address boundaries. For example, a data transfer may have start and end memory addresses that each coincide with a memory boundary. In this case, no masking is needed. In another scenario, a data transfer may have a start memory address that is aligned with a memory boundary and an end memory address that falls between memory boundaries. In this case, post-masking is carried out to ignore memory locations between the end memory address and the closest subsequent memory address boundary. In yet another scenario, a data transfer may have a start memory address that falls between memory boundaries and an end memory address that is aligned with a memory address boundary. In this case, pre-masking is carried out to ignore memory locations between the start memory address and the closest previous memory address boundary. In a further scenario, a data transfer may have start and end memory addresses that each fall between memory boundaries. In this case, both pre-masking and post-masking are needed.

The FPGA 100 includes an FPGA fabric 238, and a memory controller 240 that serves as a data transfer portion. In regard to data to be written into or read from the DRAM 232, the FPGA fabric 238 is configurable for transfers of data having one or more predetermined word widths. For example, the FPGA fabric 238 can be configured to receive and transmit data having a word width of 32 bits, 64 bits, or 128 bits.

Alternatively, the FPGA fabric 238 could be designed to receive or transmit words having any other suitable width. In addition, the FPGA fabric 238 can be configured to receive and transmit data having a first word width that is one of 32, 64, and 128 bits, and to also receive and transmit data having a second word width that is a different one of 32, 64, and 128 bits. The memory controller 240 facilitates transfer of data between the FPGA fabric 238 and the DRAM 232. The memory controller 240 includes memory cells 239 that are configurable structure. The memory cells 239 store information about the DRAM 232 and the memory controller 240. For example, the memory cells 239 store the memory burst length DRAM_BL and the pin count DRAM PIN_COUNT of the DRAM 232. Also, the memory cells 239 include data port configuration information for data ports that are in the memory controller 240, as well as priority information relating to command ports (command port priorities), as described in further detail later. The information stored in the memory cells 239 is specified by a user during field programming of the FPGA.

The memory controller 240 includes a portion that is a data converter 241. The data converter 241 has an interface that is coupled to the data bus 236. Also, the data converter 241 has another interface that is coupled to a data bus 242 that is 32 bits wide. In general, when the DRAM 232 is a DDR device, the data converter 241 converts data to and from the DDR format. More specifically, for a WRITE data transfer, the data converter 241 takes each word received from other circuitry within the memory controller, converts it into DDR format by splitting it into two halves, and then successively passes the two halves on to the DRAM 232. For a READ data transfer, the data converter captures each data word output by the DRAM 232, and synchronizes it to an internal clock signal of the memory controller 240. The data converter 241 takes two successive data words from the DRAM 232 (DDR format data), and combines them into a single larger data word that the data converter then passes on to other circuitry within the memory controller.

In further detail, and as discussed above, the DRAM 232 in the disclosed embodiment has a PIN_COUNT of 8 bits. With respect to data transfers between the DRAM 232 and the data converter 241, 8 bits of data are transferred on each edge of each pulse of a not-illustrated DQS signal. Accordingly, a total of 16 bits of data is transferred between the data converter 241 and the DRAM 232 on each pulse of the DQS signal. Consequently, for a READ data transfer the data converter 241 combines two 8-bit data words into a single 16-bit data word that is then passed on to other circuitry within the memory controller 240 over the data bus 242. For a WRITE data transfer, the data converter 241 takes each 16-bit data word arriving over the data bus 242, and divides it into two 8-bit data words (DDR format data) that are successively sent to the DRAM 232 over the data bus 236.

In an alternative embodiment the DRAM 232 could be a memory of the type known as a single data rate (SDR) device. In that situation, for both READ and WRITE data transfers, the data converter 241 would not alter the data passing through it in either direction.

The memory controller 240 includes a data storage portion 243 that is coupled between the FPGA fabric 238 and the data converter 241, and that is configurable by a user during field programming of the FPGA. The data storage portion 243 temporarily stores data that is being transferred between the FPGA fabric 238 and the DRAM 232. The data storage portion 243 includes eight independently controlled data ports 244-251 that each include a first-in-first-out (FIFO) storage device serving as a storage element. Each of the data ports 244-251 can store up to 64 words that are each 32 bits wide. In addition, the data ports 244-251 can be concatenated during field configuration. For example, two of the data ports 244-251 can be concatenated to form a 64-bit data port, or four of the data ports 244-251 can be concatenated to form a 128-bit data port. In this regard, the data storage portion 243 can be configured to have (1) only 32-bit data ports, (2) a combination of 32-bit and 64-bit data ports, (3) only 64-bit data ports, or (4) only 128-bit data ports. In this manner, the memory controller 240 is configurable to facilitate transfer of FPGA data words having widths of 32, 64, and/or 128 bits.

The data ports 244 and 246 provide unidirectional storage for data transfers from the DRAM 232 to the FPGA fabric 238 (READ). The data ports 245 and 247 provide unidirectional storage for data transfers from the FPGA fabric 238 to the DRAM 232 (WRITE). The pair of data ports 244 and 245 and the pair of data ports 246 and 247 form respective bidirectional dual data ports 252 and 253. The data ports 248-251 also provide unidirectional data storage, and are each configurable to temporarily storing data during either READ or WRITE data transfers. The ports 248-251 must each be designated as either a read port or a write port during user configuration, and that designation does not thereafter change. There are a variety of possible configurations for the data storage portion 243.

In more detail, in one configuration the data storage portion 243 is configured to have only 32-bit data storage elements. In this scenario, the data ports 244 and 246 each provide unidirectional storage for READ data transfers and the data ports 245 and 247 each provide unidirectional storage for WRITE data transfers. Moreover, the other four data ports 248-251 are independently configured so that each provides unidirectional storage for one of READ data transfers or WRITE data transfers. Thus, the four data ports 248-251 could be configured as (1) four data ports that each provide unidirectional storage for READ data transfers, (2) one data port that provides unidirectional storage for READ data transfers and three data ports that provide unidirectional storage for WRITE data transfers, (3) two data ports that provide unidirectional storage for READ data transfers and two data ports that provide unidirectional storage for WRITE data transfers, (4) three data ports that provide unidirectional storage for READ data transfers and one data port that provides unidirectional storage for WRITE data transfers, or (5) four data ports that each provide unidirectional storage for WRITE data transfers.

In another scenario, the data storage portion 243 is configured to have 64-bit data storage elements. For example, the data ports 244 and 246 can be concatenated and the data ports 245 and 247 can be concatenated to form data storage elements that respectively provide for 64-bit READ and WRITE data transfers. When the data ports 244-247 are concatenated to form 64-bit storage elements, the data ports 248-251 can each be configured to operate as a 32-bit data port, or can alternatively be configured to define two 64-bit storage elements. For example, the data ports 248 and 250 can be concatenated to form a data storage element that handles 64-bit READ data transfers, and the data ports 249 and 251 can be concatenated to form a data storage element that handles 64-bit WRITE data transfers. If the data ports 248-251 are concatenated to define two 64-bit storage elements, then the data ports 244-247 can be configured as either four 32-bit storage elements or as two 64-bit storage elements.

In yet another scenario, the data storage portion 243 is configured to have only 128-bit storage elements. In this scenario, the data ports 244, 246, 248, and 250 are concatenated to form a data storage element that provides temporary storage for 128-bit words during READ data transfers, and the data ports 245, 247, 249, and 251 are concatenated to form a data storage element that provides temporary storage for 128-bit words during WRITE data transfers.

To facilitate the discussion that follows, assume that in FIG. 3 the data storage portion 243 is configured to provide for a combination of 32-bit and 64-bit data storage elements. In particular, assume that the data ports 244 and 246 are concatenated and that the data ports 245 and 247 are concatenated to form two 64-bit storage elements that respectively provide temporary storage for READ and WRITE data transfers. In addition, assume that the data ports 248 and 250 are each configured to provide temporary 32-bit storage for READ data transfers, while the data ports 249 and 251 are each configured to provide temporary 32-bit storage for WRITE data transfers.

Each of the data ports 244-251 produces a status flag signal STATUS FLAG that is supplied to the FPGA fabric 238. In particular, status flag signals STATUS FLAG 0R, STATUS FLAG 0W, STATUS FLAG 1R, STATUS FLAG 1W, STATUS FLAG 2, STATUS FLAG 3, STATUS FLAG 4, and STATUS FLAG 5 are respectively produced by the data ports 244-251. Each STATUS FLAG signal indicates when the associated data port is empty if that data port is configured for READs, or indicates when that data port is full if the data port is configured for WRITEs. If two or four data ports are concatenated, then only one STATUS FLAG corresponding to the last of those concatenated data ports is actually used. For example, in the configuration of FIG. 3, the signal STATUS FLAG 1R for data port 246 is used to indicate when concatenated data ports 244 and 246 are empty, while STATUS FLAG 0R for data port 244 is ignored. Similarly, the signal STATUS FLAG 1W for data port 247 is used to indicate when concatenated data ports 245 and 247 are full, while STATUS FLAG 0W for data port 245 is ignored. Each of the STATUS FLAGs from the data ports 248 and 250 indicates when that data port is empty. Also, each of the STATUS FLAGs from the data ports 249 and 251 indicates when that data port is full. Each of the data ports 244-251 is coupled to a respective one of eight bidirectional buses 255-262 that each extend between that data port and the FPGA fabric 238, and that each include lines for control signals, as well as 32 lines for data signals. Each of the buses 255-262 and the associated STATUS FLAG signal serve as an interface between the fabric 238 and a respective one of the data ports 244-251. Each of the data ports 244-251 is also coupled to the common data bus 242 that is 32 bits wide. Also, the data ports 244-251 have respective enable inputs 282-289 for receiving respective active-high enable signals DF_EN 0R, DF_EN 0W, DF_EN 1R, DF_EN 1W, DF_EN 2, DF_EN 3, DF_EN4, and DF_EN 5. Each of these enable signals independently enables a respective data port 244-251 to accept and store data, or to output previously stored data.

Each of the data ports 244-251 has a respective one of eight mask outputs 293-300 at which it can produce a respective one of eight active-high signals MASK 0R, MASK 0W, MASK 1R, MASK 1W, MASK 2, MASK 3, MASK 4, and MASK 5. These mask signals each depend on the corresponding enable signal. For example, consider data port 244. If the enable signal DF_EN 0R that is received at the enable input 282 is asserted, the mask signal MASK 0R at the mask output 293 is set to a logic low. Conversely, if the enable signal DF_EN 0R that is received at the enable input 282 is deasserted, the mask signal MASK 0R at the mask output 293 is set to a logic high. The memory controller 240 includes an eight-input NOR gate 284 with 8 inverting inputs that are coupled to the respective mask outputs 293-300 of the data ports 244-251. The NOR gate 284 outputs a signal MASK that is supplied to the mask input 237 of the DRAM 232.

An explanation is now provided of the operation of the data storage portion 243 for a data transfer of a 64-bit word from the FPGA fabric 238 to the DRAM 232, or in other words a memory WRITE. As discussed above, it is being assumed for the sake of this discussion that data ports 245 and 247 are concatenated to form a 64-bit storage element. Assume that the 64-bits of data are to be supplied through the 64-bit data storage element defined by the concatenated ports 245 and 247. The FPGA fabric 238 first checks the signal STATUS FLAG1W from the data port 247 in order to determine whether data ports 245 and 247 are currently full. If they are, then the fabric 238 waits. Otherwise, the fabric 238 can put data into the concatenated data ports 245 and 247. More specifically, the FPGA fabric 238 transfers half of the 64-bits in parallel across the data bus 255 and into the data port 245, while simultaneously transferring the other half of the 64 bits in parallel across the data bus 256 and into the data port 247. Later, the data ports 245 and 247 are sequentially enabled so that the 32 bits of data stored in each of these data ports are sequentially transferred across the data bus 242 and into the data converter 241 in successive groups of sixteen bits. As previously discussed, the data converter 241 splits each 16-bit word into two 8-bit words that are then transferred successively across the data bus 236 and into the DRAM 232.

In greater detail, first the enable signal DF_EN 0W is asserted to enable the data port 245 so that the 32 bits in that data port are transferred in two successive groups of sixteen bits to the data converter 241. The data converter 241 divides each 16-bit data word received from the data port 245 into a pair of 8-bit data words that conform with the DDR standard, and then successively transfers these two 8-bit data words over the data bus 236 to the DRAM 232. The data port 245 remains enabled until all 32 bits have been transferred. Then, the enable signal DF_EN 0W is deasserted to disable the data port 245, and the enable signal DF_EN 1W is asserted to enable the data port 247, so that the 32 bits in data port 247 are transferred in two successive groups of sixteen bits over the data bus 242 to the data converter 241. The data converter 241 divides each 16-bit data word received from the data port 247 into two 8-bit data words that conform with the DDR standard, and successively transfers these 8-bit data words over the data bus 236 to the DRAM 232. The data port 247 remains enabled until all 32 bits have been transferred. This is one example of how data is transferred from the FPGA fabric 238 to the DRAM 232.

An explanation is now provided of the operation of the data storage portion 243 for a data transfer of 64 bits of data from the DRAM 232 to the FPGA fabric 238 (READ). As discussed above, it is being assumed for the sake of this discussion that data ports 244 and 246 are concatenated to form a 64-bit storage element. Assume that the FPGA fabric 238 decides the 64-bit data storage element defined by the concatenated data ports 244 and 246 is to be used for the transfer. The DRAM 232 supplies to the data converter 241 the 64 bits of data as eight successive 8-bit words. Then, as previously explained, the data converter 241 combines successive pairs of the 8-bit words to obtain four 16-bit words, and then it supplies the 64 bits of data over the data bus 242 to the data ports 244 and 246 in successive words or groups of 16 bits each. The enable signals DF_EN 0R and DF_EN 1R are sequentially asserted so that the data ports 244 and 246 are sequentially enabled to store this incoming data. First the enable signal DF_EN 0R is asserted so that the data port 244 accepts from the bus 242 two successive 16-bit words, until the 32-bit width of the data port 244 is filled. When the width of the data port 244 is full, the enable signal DF_EN 0R is deasserted so that the data port 244 is disabled. Then the enable signal DF_EN 1R is asserted so that the data port 246 accepts from the bus 242 the next two successive 16-bit words. This is one example of how data is accepted and stored by the storage portion 243 during a READ transfer. This data is temporarily stored in the data storage portion 243 until the FPGA fabric 238 retrieves it. In this regard, the signal STATUS FLAG 1R from data port 246 indicates to the fabric 238 whether the concatenated data ports 244 and 246 are empty or contain data. If STATUS FLAG 1R indicates they contain data, then in due course the FPGA fabric 238 retrieves this data from the data ports 244 and 246 in a manner so that all 64-bits are simultaneously transferred in parallel from the data ports 244 and 246 to the fabric over the two buses 255 and 257.

The memory controller 240 further includes a command storage portion 306 that is coupled to the FPGA fabric 238, and that includes six command ports 309-314. The six command ports 309-314 include two command ports 309 and 310 that each correspond to a respective one of the two bidirectional dual data ports 252 and 253, and includes four command ports 311-314 that each correspond to a respective one of the other four data ports 248-251. The command ports 309-314 include FIFOs that can each store up to 4 commands each, for later processing by the memory controller 240. The command ports 309-314 each have an input that is coupled to a respective one of six command data lines CMD 0, CMD 1, CMD 2, CMD 3, CMD 4, and CMD 5, which are each also coupled to the FPGA fabric 238. The command storage portion 306 receives commands from the FPGA fabric 238 that call for transfers of data between the FPGA fabric 238 and the DRAM 232.

The command ports 309-314 each have an input for receiving a respective one of six active-high signals CMD STATUS FLAG 0, CMD STATUS FLAG 1, CMD STATUS FLAG 2, CMD STATUS FLAG 3, CMD STATUS FLAG 4, and CMD STATUS FLAG 5. Each of these signals indicates to the associated command port that a command is being read from that command port. Moreover, the command ports 309-314 each have an output that provides a respective one of six active-high signals FULL FLAG 0, FULL FLAG 1, FULL FLAG 2, FULL FLAG 3, FULL FLAG 4, and FULL FLAG 5 to the FPGA fabric 238, in order to indicate when that command port is full. In addition, the command ports 309-314 each have an output that provides a respective one of six active-high signals EMPTY FLAG 0, EMPTY FLAG 1, EMPTY FLAG 2, EMPTY FLAG 3, EMPTY FLAG 4, and EMPTY FLAG 5. Each of these EMPTY FLAG signals indicates when the corresponding command port is empty.

The command port priorities stored in the memory cells 239 inform the memory controller 240 of a user-specified order in which the command ports should be polled and read. During operation of the memory controller 240, the command ports are checked in an order specified by the command priorities, and the first command port that is not empty and meets some other conditions is selected. In that regard, the memory controller 240 includes a command selector 318 that is a six-to-one selector for selecting one of the six command ports 309-314. The command selector 318 has six inputs that are each coupled to a respective one of the command ports 309-314, a select input that receives a 3-bit select signal CMD_PORT_SEL, and an output to which it supplies a selected command CMD.

The memory controller 240 includes a controller core 319 that is coupled between the command selector 318 and the DRAM 232. The controller core 319 includes a command request output 320 that outputs a signal CMD REQ for requesting that a command be read from the command storage portion 306, as discussed in more detail later. The controller core 319 also has an input 321 that receives a signal CMD IN. The signal CMD IN indicates that a command is currently being read from the command storage portion 306. The controller core 319 further includes a command input 324 that is coupled to the output of the selector 318, and that receives a command CMD. In addition, the controller core 319 includes a command count input 325 that receives a signal CMD_CNT. The signal CMD_CNT is received when a command is being read from the command storage portion 306, and indicates the minimum number of memory access cycles that must be executed by the DRAM 232 in order to carry out the data transfer request in the selected command. The controller core 319 also includes a FIFO 328 that is a storage section for temporarily storing information about each command received from the output of the command selector 318. The FIFO 328 stores up to 4 words, and therefore can store information relating to up to 4 commands received from the output of the command selector 318. This information is later used by the controller core 319 when executing those commands. For example, for each command, the FIFO 328 stores a memory address from the command, and information indicating whether the command is a read or write request. Also, the FIFO 328 stores the CMD_CNT value provided for that command at the command count input 325.

The controller core 319 has outputs that supply control and addressing signals to the DRAM 232 for execution of a command. In particular, the controller core 319 includes a memory control output 329 that supplies the signals MEM CTRL to the memory control input 233 of the DRAM 232. Moreover, the controller core 319 includes a memory address output ADDR 330 that supplies a memory address to the memory address input ADDR 235 of the DRAM 232. In addition, the controller core 319 includes an output 331 at which it produces a memory read enable signal MEMORY READ EN that is actuated at the start of a memory READ. Also, the controller core 319 includes an output 332 at which it produces a memory write enable signal MEMORY WRITE EN that is actuated at the start of a memory WRITE.

In the course of operation, the controller core 319 requests a command by producing the signal CMD REQ at the output 320. In due course, the controller core 319 receives the signal CMD IN at the input 321, which indicates that a command is being read from the command storage portion 306 and is present at the command input 324 of the controller core 319. The controller core 319 also receives the signal CMD_CNT at its input 325. The controller core 319 stores in its FIFO 328 some of the information from the command that is being read in, along with the CMD_CNT value, as discussed above. The controller core 319 repeats this process in an effort to keep the FIFO 328 filled with information and CMD_CNT values for up to four different commands, pausing temporarily whenever the FIFO 328 happens to be full. Meanwhile, the controller core 319 is separately and independently executing these commands as they reach the opposite end of the FIFO 328. At any time, when the controller core 319 is ready to execute a command that has reached the end of the FIFO 328, the controller core 319 uses the information about the command from the FIFO 328 to supply the appropriate addressing and control signals to the DRAM 232.

The memory controller 240 includes an arbiter 338 that determines the order in which commands are read in from the command ports, based in part on the priority information stored in the memory cells 239. Also, the arbiter 338 controls the data ports 244-251 in a manner causing them to partially assemble and disassemble data that is being transferred between the FPGA fabric 238 and the DRAM 232, as outlined earlier.

The arbiter 338 is coupled to the command storage portion 306, the command selector 318, the memory cells 239, the controller core 319, and the data storage portion 243. The arbiter has a set of inputs 343-346 that are coupled to the memory cells 239 and that respectively receive the memory burst length DRAM_BL, the memory pin count DRAM PIN_COUNT, the data port configuration, and the command port priorities. The arbiter 338 also has a set of command port empty flag inputs 350-355 that each receive a respective one of the EMPTY FLAG signals from the command ports 309-314. These signals let the arbiter know whether or not each of the command ports 309-314 is currently empty. In addition, the arbiter 338 has a command request input 359 that receives the signal CMD REQ from the command request output 320 of the controller core 319. In response to receiving the signal CMD REQ from the controller core 319, the arbiter 338 selects and reads a command from one of the command ports 309-314 in the command storage portion 306, as discussed later.

The arbiter 338 includes a command port select output 360 for supplying the select signal CMD_PORT_SEL that controls the six-to-one selector 318. The signal CMD_PORT_SEL selects which one of the command ports 309-314 should be read, based on factors such as the command port priorities stored in the memory cells 239, and the EMPTY FLAG signals. The handling of priorities is discussed in more detail later.

The arbiter 338 further has a command input 361 that is coupled to the output of the selector 318, and that receives the selected command CMD. Moreover, the arbiter 338 includes some FIFOs 362 that store information about a command received at the command input 361, and other information determined by the arbiter, as discussed in more detail later. Each of the FIFOs 362 can store up to 4 words.

In addition, the arbiter 338 includes a set of command port status outputs 364-369 that each supply a respective one of the six signals CMD STATUS FLAGS 0-5 to a respective one of the command ports 309-314. In addition, the arbiter 338 has an output 375 that supplies the signal CMD IN to the controller core 319 to indicate that a command is being read from the command storage portion 306. Moreover, the arbiter 338 includes a command count output 376 that supplies the CMD_CNT value to the command count input 325 of the controller core 319.

The arbiter 338 includes a memory read enable input 381 that is coupled to the memory read enable output 331 of the controller core 319, and that receives the signal MEMORY READ EN. In addition, the arbiter 338 includes a memory write enable input 382 that is coupled to the memory write enable output 332 of the controller core 319, and that receives the signal MEMORY WRITE EN. The arbiter further includes a SUBPORT FIFO 383 that stores the addresses of selected data ports 244-251 that are currently being used for a data transfer. The SUBPORT FIFO 383 is 4 words deep, and therefore can store up to four addresses. For example, in a 32-bit data transfer, only one of the 32-bit data ports 244-251 is used, and the SUBPORT FIFO 383 stores only one data port address. In a 64-bit data transfer, two of the 32-bit data ports 244-251 are used, and the SUBPORT FIFO 383 stores two data port addresses. In a 128-bit data transfer, four of the 32-bit data ports are used, and the SUBPORT FIFO 383 stores four data port addresses.

The arbiter 338 also includes a set of enable outputs 391-398 that are each coupled to a respective one of the data ports 344-251, and that each carry a respective one of the enable signals DF_EN 0R, DF_EN 0W, DF_EN 1R, DF_EN 1W, DF_EN 2, DF_EN 3, DF_EN4, and DF_EN 5.

In operation, the arbiter 338 receives a command request signal CMD_REQ from the controller core 319. The command request signal CMD_REQ prompts the arbiter 338 to read a command CMD from the command storage portion 306. In more detail, the arbiter 338 selects a command port from the command storage portion 306 via the selector 318. The selection is based on factors that include the command priorities stored in the memory cells 239, and the signals EMPTY FLAG 0-5 that are received at the inputs 343-346. The arbiter 338 goes through the EMPTY FLAG signals from the command ports in a predetermined sequence defined by the command priorities, and selects the first command port that is not empty.

When a command is read from the command storage portion 306, the command CMD is supplied to the output of the selector 318. That command CMD arrives at the command input 361 of the arbiter 338. The arbiter 338 extracts certain information from the command CMD, and stores that information in the FIFOs 362. For example, from the command CMD, the arbiter 338 extracts a portion of the memory address, a user burst length that is the amount of data requested to be transferred, and the address of the data port through which the data is to be transferred. In addition, the arbiter 338 generates masking information (discussed in greater detail later) that is stored in the FIFOs 362 and that indicates whether it is necessary to ignore portions of memory blocks that are accessed in carrying out a data transfer. Also, the arbiter 338 sends the controller core 319 the signal CDM IN to indicate to the controller core 319 that a command is being read in. Moreover, the arbiter 338 generates and sends the value CMD_CNT to the controller core 319 for that command. In addition, after a command has been read in, the arbiter 338 actuates a respective one of the signals CMD STATUS FLAG 0-5, in order to advise the selected command port that a command is being read from that command port. After one or more commands have been read by the arbiter 338, the arbiter waits for one of the signals MEMORY READ EN and MEMORY WRITE EN to go high. If the signal MEMORY READ EN goes high, the arbiter 338 facilitates a read transfer, as discussed in more detail below. If the signal MEMORY WRITE EN goes high, the arbiter 338 facilitates a write transfer, as also discussed in more detail below.

A high-level description of the operation of the entire memory controller 240 will now be provided. The memory controller 240 facilitates transfers of data between the FPGA fabric 238 and the DRAM 232. As discussed above, for purposes of this discussion it is being assumed that the DRAM 232 has a burst length of 8 words, and that the word width of the DRAM is 8 bits. Also recall that, for purposes of this discussion, it is being assumed that the data port configuration is such that the data ports 244 and 246 are concatenated for 64-bit read transfers, the data ports 245 and 247 are concatenated for 64-bit write transfers, data ports 248 and 250 are each separately configured for 32-bit read transfers, and data ports 249 and 251 are each configured for 32-bit write transfers. Before providing a write command to the command storage portion 306, the FPGA fabric 238 loads the data to be transferred into the appropriate data port. For example, the FPGA fabric looks at the STATUS FLAG signal from the particular data port that is to be used to temporarily store data for the transfer. When the STATUS FLAG is asserted, the corresponding data port is full, and the fabric 238 has to wait before providing that data port with data. When that STATUS FLAG is deasserted, the corresponding data port is available to accept data. The FPGA fabric 238 can then supply all of the data to be transferred to the appropriate data port before providing the associated write command to the command storage portion 238.

The FPGA fabric 238 supplies the command storage portion 306 with commands in the following manner. The FPGA fabric 238 checks to see if a command port FIFO is full before loading a command into that command port. When any one of the command ports 309-314 is full, its FULL FLAG is asserted so that the FPGA fabric 238 knows that command port is full. The FPGA fabric 238 selectively loads commands into the command ports 309-314 that are not full, as necessary for desired memory reads or writes. In due course, the controller core 319 requests that a command be read in from the command storage portion 306, by supplying the signal CMD REQ to the arbiter 338. The arbiter 338 then selects a command port based on the EMPTY FLAG signals 350-353, and the command port priorities specified by the memory cells 239. For example, as explained earlier, the arbiter 338 selects a command port by going through the EMPTY FLAGS of the command ports in a predetermined sequence that is defined by the command port priorities stored in the memory cells 239, and by selecting the first command port in that sequence that is not empty. The arbiter 338 accesses the selected command port by sending the appropriate select signal CMD_PORT_SEL to the select input of the command selector 318. The selected command is then supplied to the output of the command selector 318.

The command supplied to the output of the command selector 318 makes its way to the command inputs 324 and 361 of the controller core 319 and the arbiter 338, respectively. The controller core 319 receives the command at its input 324, and extracts certain information from that command. Meanwhile, the arbiter 338 receives the same command at its input 361, and also extracts information from the command.

The arbiter uses the DRAM_BL, the DRAM PIN_COUNT, and the DATA PORT CONFIGURATION from the memory cells 239, along with some information extracted from the command, to determine masking information and a value CMD_CNT corresponding to that command. After determining the command count CMD_CNT, the arbiter 338 supplies the command count CMD_CNT to the input 325 of the controller core 319. The arbiter 338 then supplies the signal CMD IN to the controller core 319 to indicate that a command is currently being read from the command storage portion 306, and is arriving at the input 324 of the controller core. The controller core 319 stores the CMD_CNT value in the FIFO 328, along with information extracted from the command, such as a starting memory address, and whether the memory access will be a READ or WRITE. Meanwhile, the arbiter 338 stores the mask information it has generated into the FIFOs 326, along with information extracted from the command, such as the user burst length, and the address of the data port that will be used for the transfer. The arbiter 338 sends one of the signals CMD STATUS FLAGs 0-5 to the command port from which the command is being read, so that the command port knows that a command is being read from it. This process of filling up the FIFOs 328 and 362 in the controller core 319 and arbiter 338, respectively, is carried out generally continuously in an effort to keep the FIFOs filled with up to four commands, with temporary pauses whenever the FIFOs become temporarily full.

Meanwhile, in parallel with this process of loading commands into the FIFOs 328 and 362, the controller core 319 and the arbiter 338 are executing commands as commands reach the opposite ends of the FIFOs 328 and 362. When a command is executed by the controller core 319 and the arbiter 338, the information previously stored for that command in the FIFOs 328 and 362 is extracted and used to execute the command.

The controller core 319 initiates execution of each command by sending the starting memory address to the ADDR input 235 of the DRAM 232, and by sending control signals to the MEM CTRL inputs 233 of the DRAM 232. Moreover, the controller core 319 supplies a read or write enable signal MEMORY READ EN or MEMORY WRITE EN to the arbiter 338 at one of its respective inputs 381 and 382. In response to receipt of either of these signals, the arbiter 338 reads from its FIFOs 362 the information for that command, and then loads the SUBPORT FIFO 383 with one or more data port addresses that are to be used for the data transfer. Based on the command and mask information stored in the FIFOs 362, the arbiter 338 selectively asserts the DF_EN signals in a manner so that the particular data port(s) being used for that data transfer are enabled at appropriate times.

For a READ data transfer, the DRAM 232 transfers data in successive words of 8 bits each over the data bus 236 and into the data converter 241. Each pair of successive 8-bit words that are supplied to the data converter 241 are combined into a single 16-bit word that is subsequently transferred over the data bus 242 to the data storage portion 243. The arbiter 338 produces the appropriate enable signals DF_EN so that the data is accepted by and stored in the appropriate data port or ports in the data storage portion 243. Eventually, 32 bits of data is stored in each data port being used for the 64-bit READ transfer. In due course, the FPGA fabric 238 simultaneously reads from the two data ports being used for the transfer the 32 bits of data stored in each of those data ports.

For a WRITE data transfer, the arbiter 338 asserts one or more of the enable signals DF_EN enable so that the 32 bits of data in each data port being used for the WRITE transfer are transferred in successive groups of sixteen bits over the data bus 242 and into the data converter 241. Each 16-bit word that is supplied to the data converter 241 is divided into a pair of 8-bit data memory words that are successively transferred over the data bus 236 to the DRAM 232. In some situations, the start memory address and/or end memory address of the data being transferred falls on an address that is not on a memory address boundary. In such a situation, as to memory locations in the memory access that are before and/or after the locations being written, no data port is enabled, and thus the signal MASK goes high to tell the DRAM 232 that it should not change data that is already in those memory locations.

Figure 4:
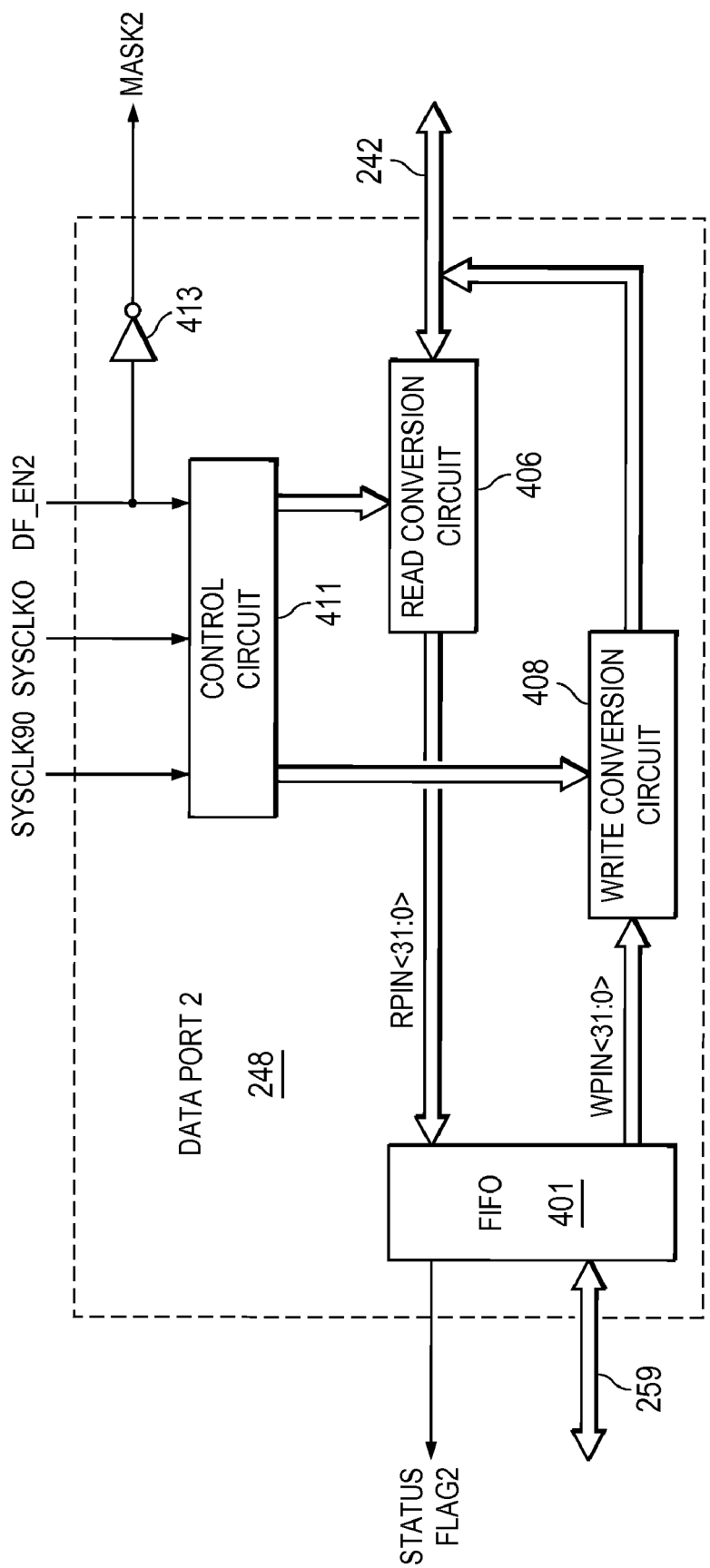
FIG. 4 is a high-level block diagram showing circuitry within a data port that is part of the memory controller circuit of FIG. 3.

The eight data ports 244-251 are generally similar, and therefore only one of them is described in greater detail below. In particular, the data port 248 will now be discussed in more detail. FIG. 4 is a high-level block diagram showing circuitry within the data port 248. FIG. 4 does not show everything within the data port 248, but instead shows only portions of the circuitry that facilitate an understanding of the disclosed embodiment of the invention. As discussed earlier, the data port 248 includes a FIFO, which is shown at 401. The FIFO 401 can store up to 64 words that are each 32 bits wide. The FIFO 401 generates the status flag signal STATUS FLAG 2, and in addition is coupled to the fabric 238 through the bus 259.

The data port 248 also includes a read conversion circuit 406 that is coupled to the FIFO 401 by a 32-bit bus RPIN<31:0>, and that is also coupled to the data converter 241 (FIG. 3) through the bus 242. As discussed earlier, the data converter 241 takes DDR data from the DRAM memory 232, and converts it to SDR format, which is then passed to the data port 248 over the bus 242. If the DRAM memory 232 is a DDR device that has a PIN_COUNT (word width) of 4, 8 or 16 bits, then the data converter 241 will convert this to words that are respectively 8, 16, or 32 bits. In configurations where the data converter 241 provides 8-bit or 16-bit words to the data port 248, a further data conversion is needed to convert these into 32-bit words that are compatible with the FIFO 401. The read conversion circuit 406 performs this data conversion, in a manner described in more detail later.

The data port 248 also includes a write conversion circuit 408, which is coupled to the FIFO 401 by a 32-bit bus WPIN<31:0>, and that is also coupled through the bus 242 to the data converter 241. In effect, the write conversion circuit 408 is the functional opposite of the read conversion circuit 406. In particular, in configurations where the data converter 241 expects to receive 8-bit or 16-bit words from the data port 248, the write conversion circuit 408 takes 32-bit words from the FIFO 401, and converts them into 8-bit or 16-bit words. The write conversion circuit 408 is described in more detail later.

The data port 248 also includes a control circuit 411 that controls both the read conversion circuit 406 and the write conversion circuit 408. The control circuit 411 receives two system clock signals SYSCLK0 and SYSCLK90. In the disclosed embodiment, the signals SYSCLK0 and SYSCLK90 are 400 MHz clock signals that are synchronized with each other, but the signal SYSCLK90 has a phase lag of 90° with respect to the signal SYSCLK0. These clock signals could alternatively have some other frequency, and/or some other phase relationship. The control circuit 411 also receives the port enable signal DF_EN2 that was discussed above in association with FIG. 3. The data port 248 includes an inverter 413 having an input coupled to the port enable signal DF_EN2, and having an output that serves as the mask signal MASK2.

Figure 5:
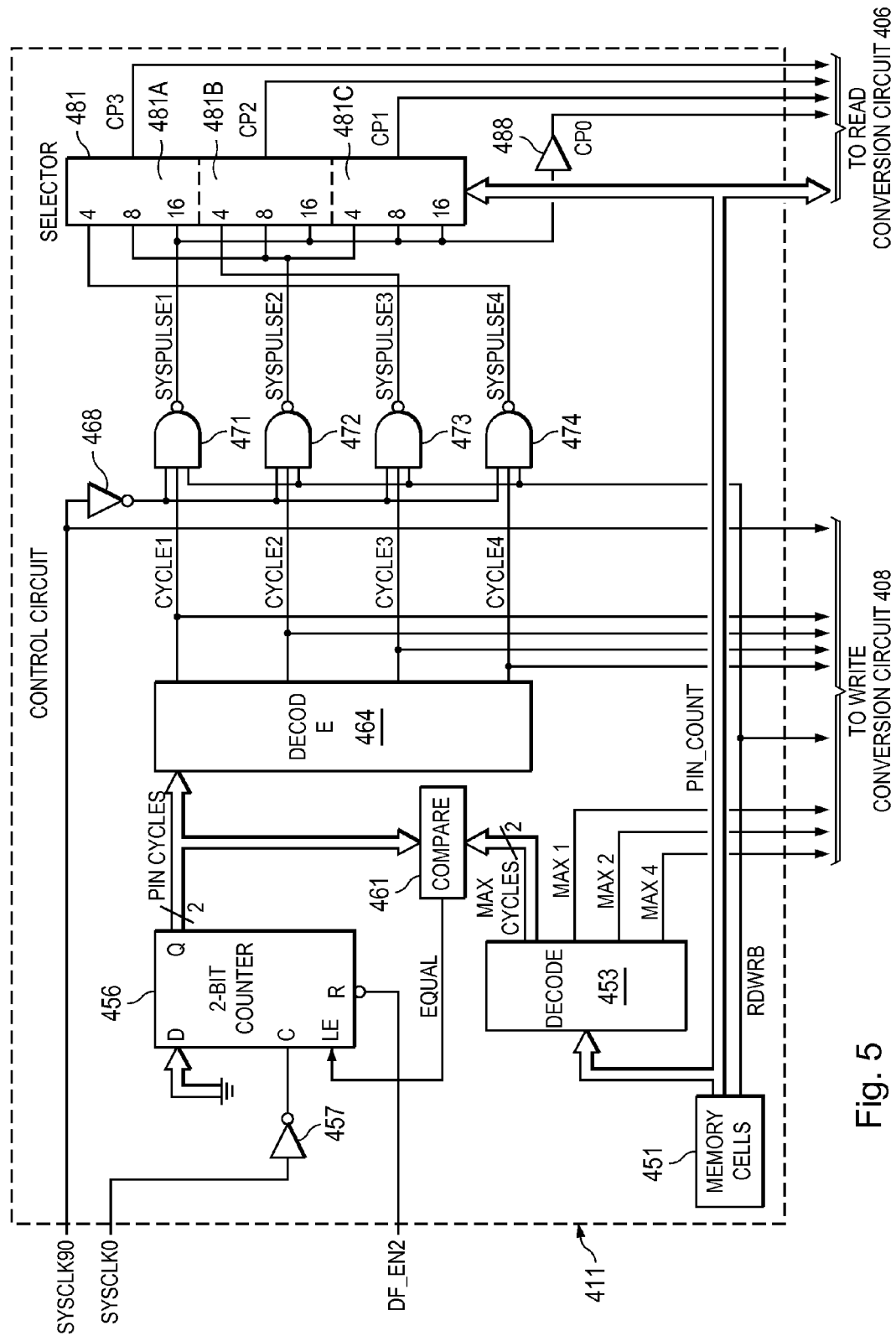
FIG. 5 is a block diagram showing in greater detail a control circuit that is part of the data port of FIG. 4.

FIG. 5 is a block diagram showing in greater detail the control circuit 411 within the data port 248 of FIG. 4. FIG. 5 does not show all of the circuitry within the control circuit 411, but instead shows only portions of the circuitry that are relevant to an understanding of the disclosed embodiment of the invention. The control circuit 411 includes configurable memory cells 451 that serve as configuration identification structure, and that are similar to the memory cells 239 (FIG. 3). The information stored in the memory cells 451 is specified by a user during field programming of the FPGA 100. The memory cells 451 store a binary bit that controls a signal RDWRB, which does not change after the memory cells 451 are field programmed. As discussed earlier, the data port 248 is configured during field programming to operate as either a read data port or a write data port. The signal RDWRB specifies whether the data port 248 is to operate as a read data port or a write data port. In particular, if the signal RDWRB is a logic high, then the data port 248 operates as a read data port, whereas if RDWRB is a logic low, then the data port operates as a write data port. The memory cells 451 also store the value PIN_COUNT which, as discussed earlier, is the word width of the DRAM memory 232, and is a value of either 4, 8 or 16. This is identically the same PIN_COUNT value that is stored in the memory cells 239 (FIG. 3), but a duplicate value is stored locally at 451 for convenience.

The control circuit 411 includes a decode circuit 453 that is responsive to the signal PIN_COUNT from the memory cells 451. The decode circuit 453 has three outputs MAX1, MAX2 and MAX4, which after field programming are static and do not change. If the signal PIN_COUNT is 4, then MAX4 is always a logic high, and MAX1 and MAX2 are always a logic low. If the signal PIN_COUNT is 8, then MAX2 is always a logic high, and MAX1 and MAX4 are always a logic low. If the signal PIN_COUNT is 16, then MAX1 is always a logic high, and MAX2 and MAX4 are always a logic low.

The decode circuit 453 also produces a 2-bit output signal MAX CYCLES, which after field programming is static and does not change. If the value of PIN_COUNT is 4, 8 or 16, then the signal MAX CYCLES is respectively "10", "01", or "00"

The control circuit 411 includes a 2-bit counter 456, which is a Gray code counter. That is, the normal count sequence is "00", "01", "11", and "10", so that only one bit changes at a time in order to avoid a possible race condition. The data inputs of the counter 456 are coupled to ground. An inverter 457 inverts the system clock signal SYSCLK0, and supplies this inverted clock to a clock input of the counter 456. The counter 456 has an active-low reset input that is coupled to the port enable signal DF_EN2. The output of the counter 456 is a 2-bit signal PIN CYCLES.

The control circuit 411 includes a compare circuit having one input coupled to the signal PIN CYCLES from the output of the counter 456, and another input coupled to the signal MAX CYCLES from the output of the decode circuit 453. When signals at the two inputs of the compare circuit 461 are equal, the compare circuit 461 sets its output signal EQUAL to a logic one. Otherwise, the output of the compare circuit 461 is a logic low. The output signal EQUAL from the compare circuit 461 is coupled to a load enable input of the counter 456. The operation of the counter 456 will be discussed in more detail later.

The control circuit 411 includes a further decode circuit 464 having inputs coupled to the signal PIN CYCLES from the output of the counter 456. The decode circuit 464 has four outputs CYCLE1, CYCLE2, CYCLE3 and CYCLE4. For each of the four possible states of the counter 456, one of the outputs of the decode circuit 464 will be a logic high, and the other three will be a logic low. In particular, when the signal PIN CYCLES from the counter 456 is "00", then CYCLE1 will be a logic high, and CYCLE2, CYCLE3 and CYCLE4 will be a logic low. When the signal PIN CYCLES from the counter 456 is "01", then CYCLE 2 will be a logic high, and CYCLE1, CYCLE3, and CYCLE4 will all be a logic low. When the signal PIN CYCLES from the counter 456 is "11", then CYCLE3 will be a logic high, and CYCLE1, CYCLE2 and CYCLE4 will all be a logic low. When the signal PIN CYCLES from the counter 456 is "10", then CYCLE4 will be a logic high, and CYCLE1, CYCLE2 and CYCLE3 will all be a logic low.

The control circuit 411 includes an inverter 468 having an input coupled to the system clock signal SYSCLK90. The control circuit 411 also includes four 3-input NAND gates 471-474, which each have one input coupled to the output of the inverter 468, and which each have another input coupled to the signal RDWRB from the memory cells 451. The remaining input of each of the NAND gates 471-474 is coupled to a respective one of the signals CYCLE1, CYCLE2, CYCLE3 and CYCLE4 from decode circuit 464. The outputs of the NAND gates 471-474 are respective intermediate signals SYSPULSE1, SYSPULSE2, SYSPULSE3, and SYSPULSE4.

The control circuit 411 includes a selector 481 having three sections 481A, 481B and 481C that each function as a three-to-one selector. These three selector sections are all controlled in response to the memory word width signal PIN_COUNT from the memory cells 451. In each of the selector sections 481A, 481B and 481C, one input is selected if the signal PIN_COUNT indicates the memory word width is 4 bits, another input is selected if the signal PIN_COUNT indicates the memory width is 8 bits, and the remaining input is selected if the signal PIN_COUNT indicates the memory word width is 16 bits. As discussed earlier, the signal PIN_COUNT becomes fixed at the time of field programming, and thus the selections made by each of the selector sections 481A, 481B and 481C also become fixed at the time of field programming, and do not dynamically change during system operation.

The "16" input of selector section 481A, the "16" input of selector section 481B, and the "8" and "16" inputs of selector section 481C are each coupled to the signal SYSPULSE1 from gate 471. The "8" input of selector section 481A, the "8" input of selector section 481B, and the "4" input of selector section of 481C are each coupled to the signal SYSPULSE2 from gate 472. The "4" input of selector section 481B is coupled to the signal SYSPULSE3 from gate 473. The "4" input of selector section 481A is coupled to the signal SYSPULSE4 from gate 474. The selector sections 481A, 481B and 481C have respective outputs CP3, CP2 and CP1. The control circuit 411 includes a non-inverting buffer 488 having an input coupled to the signal SYSPULSE1 from gate 471. The buffer 488 outputs a signal CP0.

The signals MAX1, MAX2, MAX4, RDWRB, CYCLE1, CYCLE2, CYCLE3, CYCLE4, and SYSCLK90 are all supplied to the WRITE conversion circuit 408 (FIG. 4). The signals PIN_COUNT, CP0, CP1, CP2 and CP3 are all supplied to the READ conversion circuit 406 (FIG. 4).

The operation of the control circuit 411 will now be described. During the foregoing discussion, it has been assumed for the purpose of convenience that the DRAM memory 232 (FIG. 3) has a word width of 8 bits. However, the control circuit 411 operates differently for each of the various possible word widths of the DRAM memory 232. Accordingly, for clarity, the operation of the control circuit 411 will be described separately for each permissible word width of the DRAM memory in the disclosed embodiment. Assume first that the memory cells 451 are configured during field programming so that the value PIN_COUNT indicates the word width of the DRAM memory 232 is 4 bits, and so that the signal RDWRB is a logic high to indicate that the data port 248 is to operate as a read data port. As discussed earlier, the output MAX4 from the decode circuit 453 will be a logic high, and the outputs MAX1 and MAX2 will each be a logic low. The output MAX CYCLES from the decode circuit 453 will have the value "10". In response to successive leading edges of the clock signal at its clock input, the counter 456 will progressively count up through states "00", "01", "11", and "10". When the counter reaches state "10", the compare circuit 461 will determine that its two inputs are equal, and will change its output signal EQUAL fro a logic low to a logic high, thereby actuating the load enable input of the counter 456. Consequently, on the next leading edge at its clock input, the counter 456 will be loaded with the value "00" from its data input, thereby restarting the count cycle.

Figure 6:
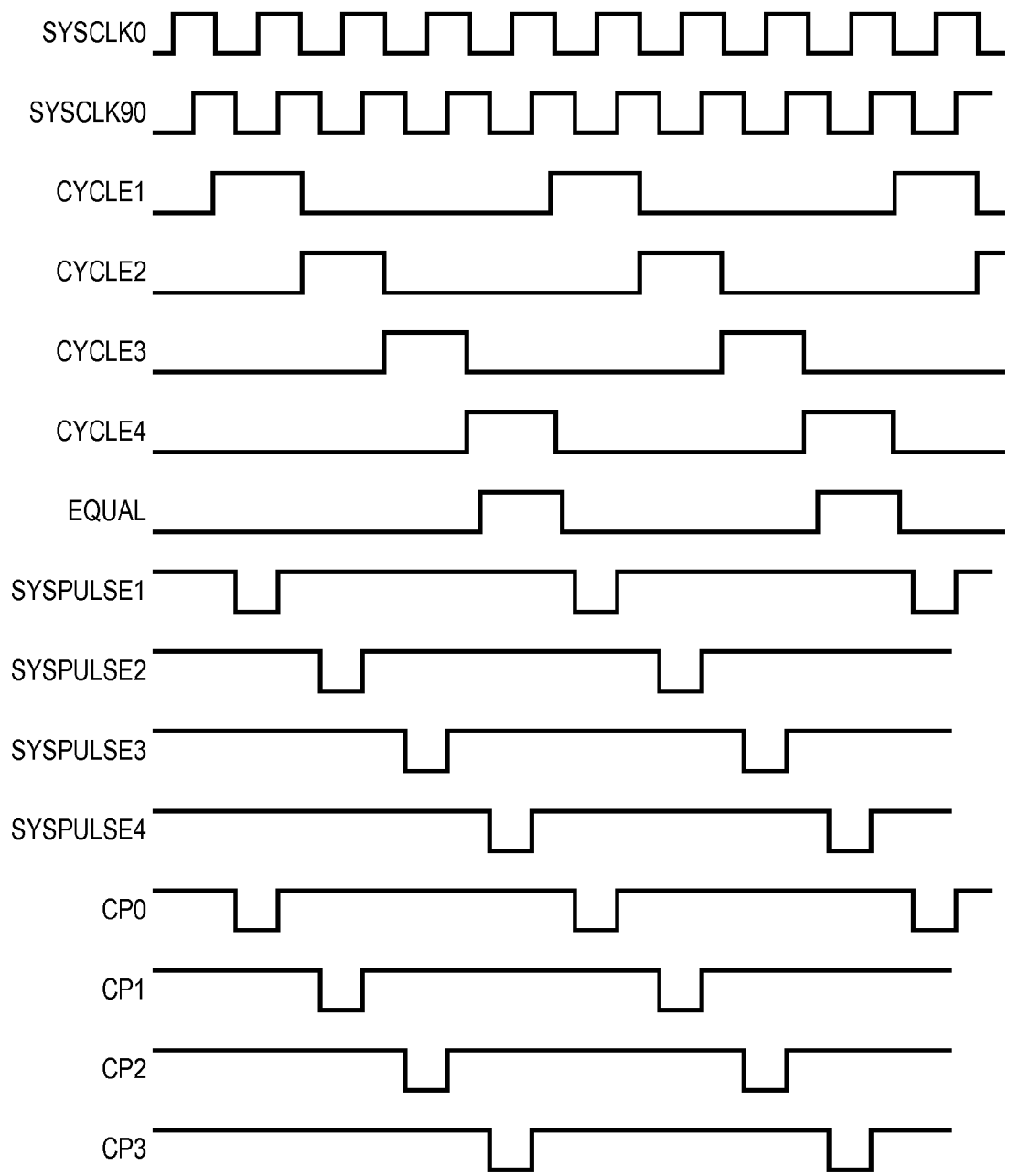
FIGS. 6-11 each depict a timing diagram showing various signals that occur within the control circuit of FIG. 5 during respective different operational configurations of the data port of FIG. 4.

As the counter 456 successively counts through the states "00", "01", "11" and "10", the decode circuit 464 will respectively actuate the signals CYCLE1, CYCLE2, CYCLE3 and CYCLE4. The gates 471-474 will all be enabled, because the signal RDWRB is a logic high. During each of the signals CYCLE1, CYCLE2, CYCLE3 and CYCLE4, the respective gates 471, 472, 473, and 474 will produce respective narrower active-low pulses on signals SYSPULSE1, SYSPULSE2, SYSPULSE3 and SYSPULSE4. The PIN_COUNT signal will be causing each of the selector sections 481A, 481B and 481C to always be selecting the "4" input thereof. As a result, the signals CP0, CP1, CP2 and CP3 will be respectively identical to the signals SYSPULSE1, SYSPULSE2, SYSPULSE3 and SYSPULSE4. FIG. 6 is a timing diagram showing various signals that occur within the control circuit 411 during operation with this particular configuration, in the manner just described.

Figure 7:
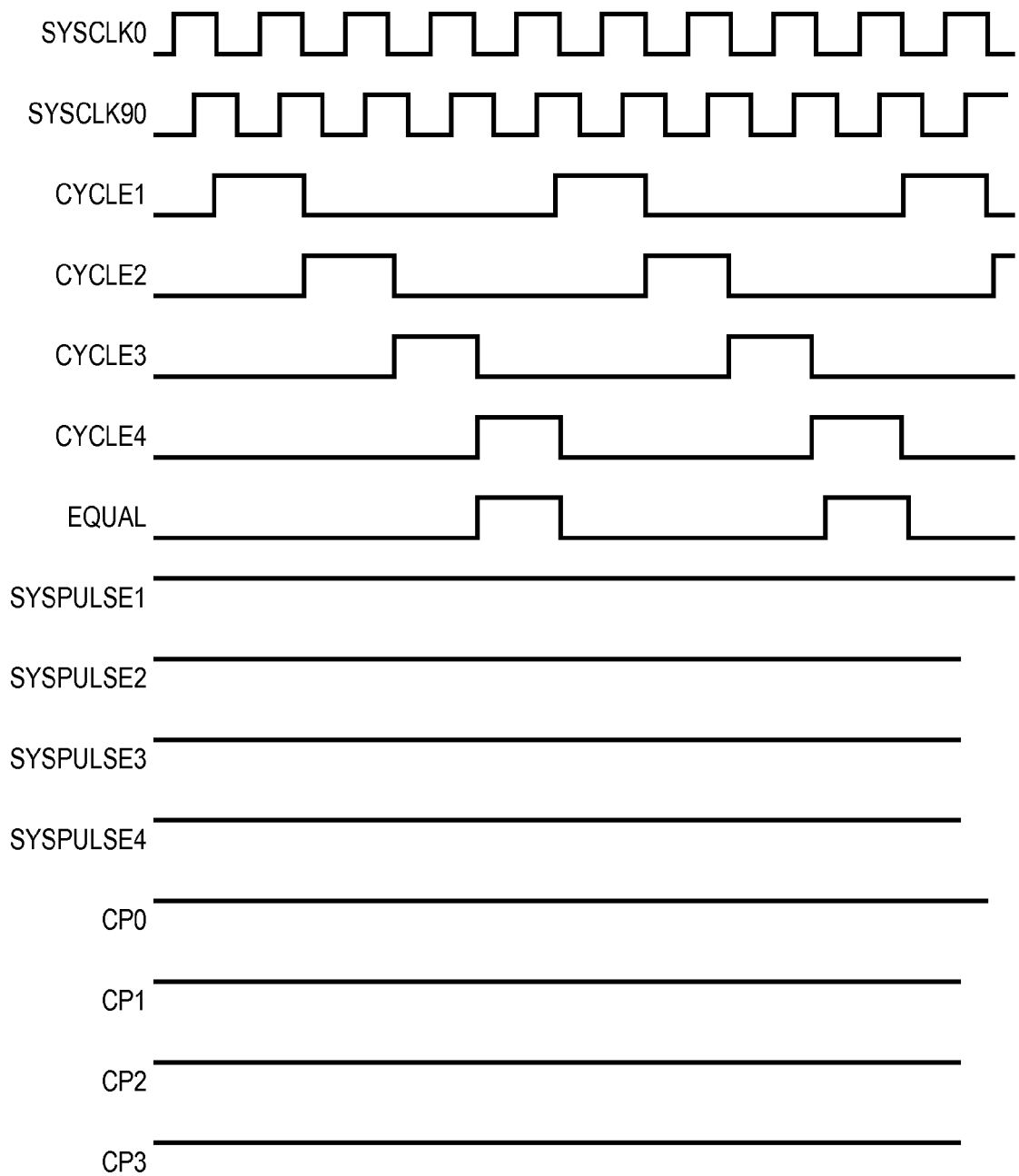

Assume next that the DRAM memory 232 still has a word width of 4 bits, but that the data port 248 has been configured during field programming to be a write data port rather than a read data port. In other words, the signal RDWRB from the memory cells 451 will be a logic low rather than a logic high. The effect on the circuit 411 is that the four NAND gates 471-474 will all be disabled. As a result, each of the signals SYSPULSE1, SYSPULSE2, SYSPULSE3, SYSPULSE4, CP0, CP1, CP2 and CP3 will always be a logic high. FIG. 7 is a timing diagram showing various signals that occur within the control circuit 411 during operation with this particular configuration.

Figure 8:
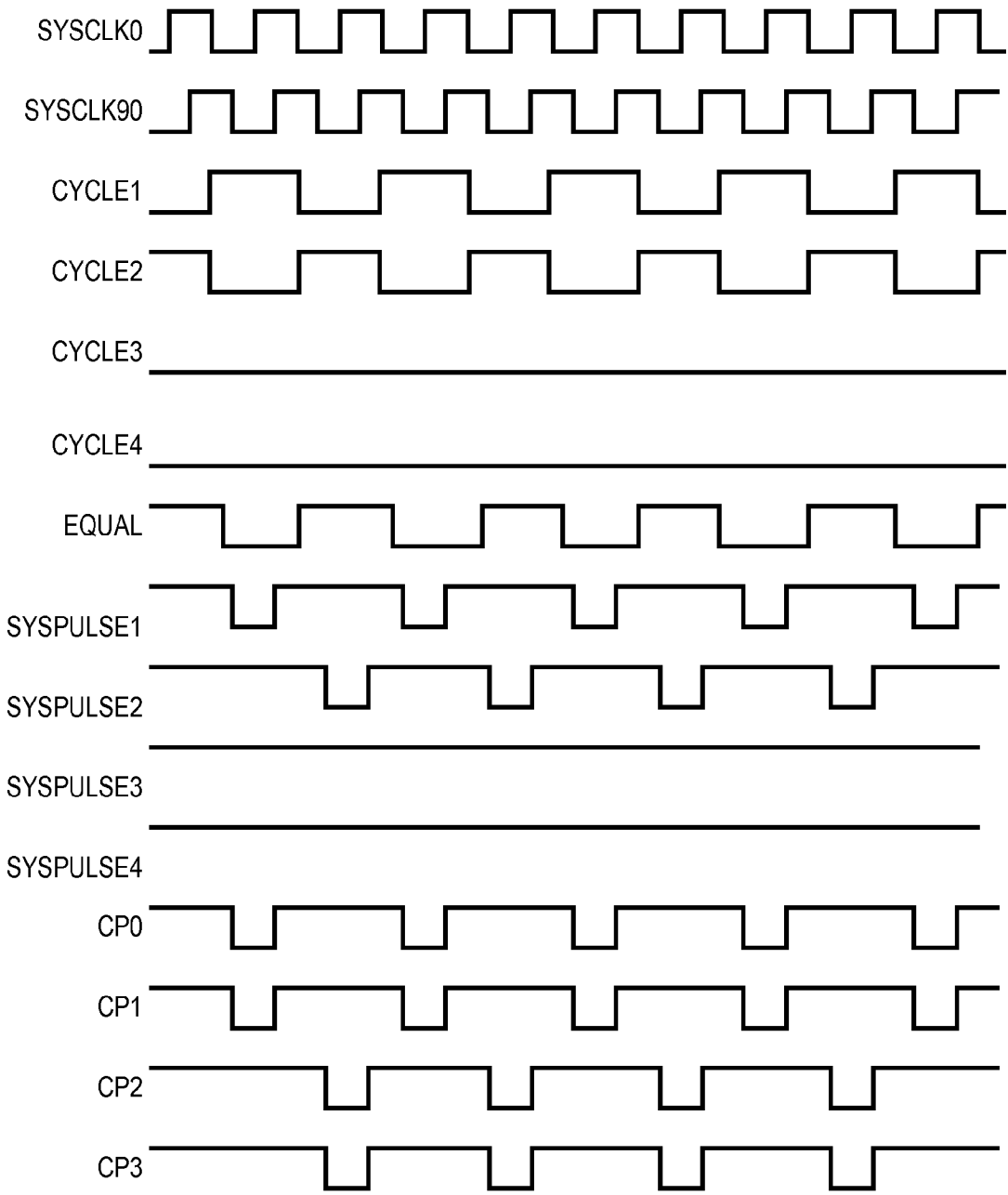

Assume now that the DRAM memory 232 has a word width of 8 bits, and that the data port 248 is configured to be a read data port. The memory cells 451 will be set during field programming so that the signal PIN_COUNT has a value of 8, and so that the signal RDWRB is a logic high. The signal MAX2 from the decode circuit 453 will be a logic high, and the signals MAX1 and MAX4 will each be a logic low. The signal MAX CYCLES from the decode circuit 453 will have a value "01". In this case, the counter 456 will count from state "00" to state "01", at which point the compare circuit 461 will determine that its two inputs are equal, and will actuate the EQUAL signal at its output, thereby causing the counter to be loaded with the value "00" from its data input to restart the count cycle. As the counter 456 successively counts through the two states "00" and "01", the decode circuit 464 will respectively actuate the signals CYCLE1 and CYCLE2. Since the counter 456 never reaches state "11" or state "10", the signals CYCLE3 and CYCLE4 will each always be a logic low. In turn, the gates 471 and 472 will produce the signals SYSPULSE1 and SYSPULSE2, but the gates 473 and 474 will not produce the signals SYSPULSE3 and SYSPULSE4. The selector sections 481A, 481B and 481C will each be continuously selecting the "8" input thereof. Consequently, the signals CP0 and CP1 will each be identically the same as the signal SYSPULSE1, and the signals CP2 and CP3 will each be identical to the signal SYSPULSE2. FIG. 8 is a timing diagram showing various signals that occur within the control circuit 411 during operation with this configuration.

Figure 9:
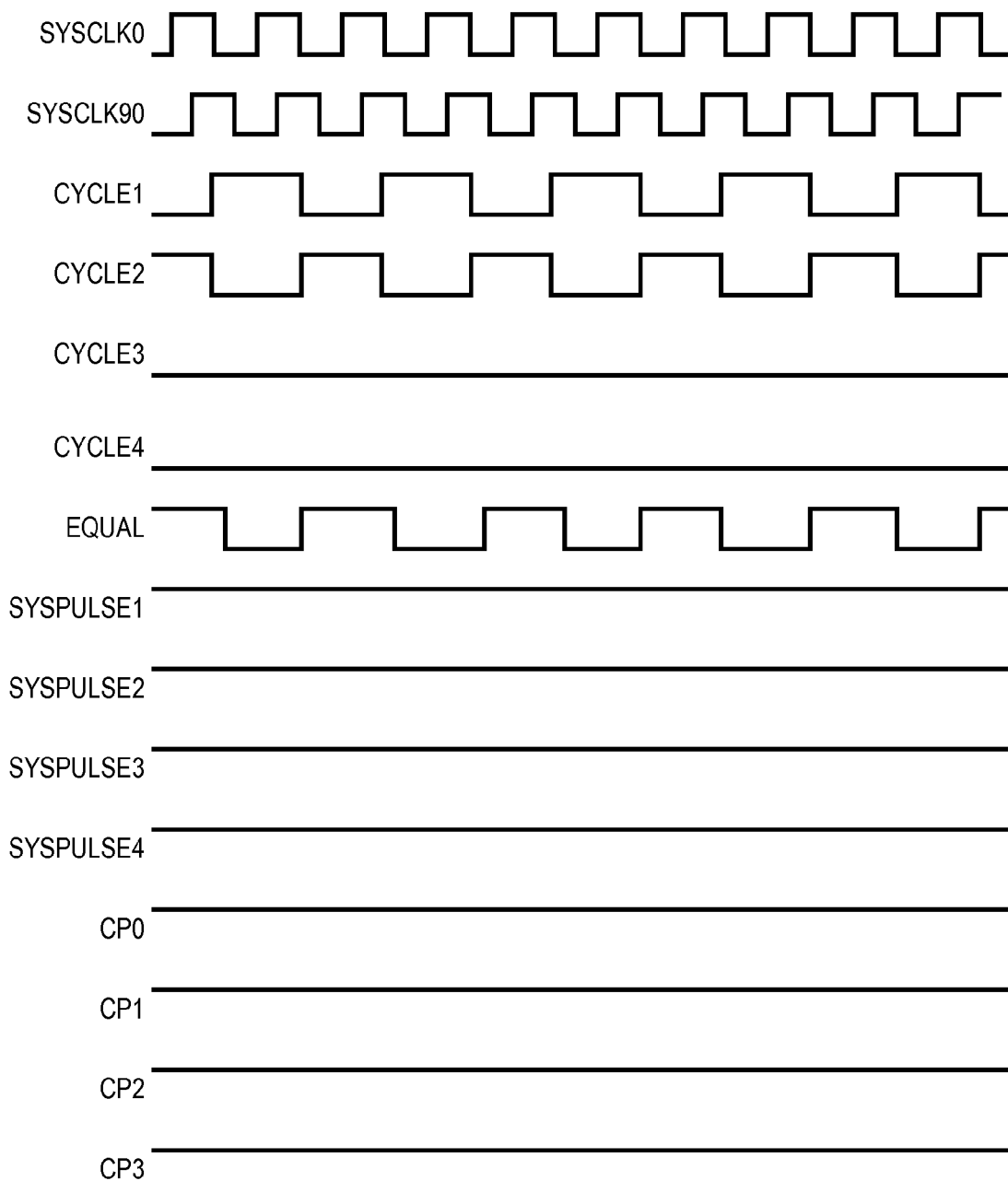

Assume now that the DRAM memory 232 has a word width of 8 bits, but that the data port 248 is configured to be a write data port rather than a read data port. In other words, the signal RDWRB from the memory cells 451 will always be a logic low, thereby disabling all of the gates 471-474. As a result, the signals SYSPULSE1, SYSPULSE2, SYSPULSE3, SYSPULSE4, CP0, CP1, CP2 and CP3 will all be a continuous logic high. FIG. 9 is a timing diagram showing various signals that occur within the control circuit 411 during operation with this configuration.

Figure 10:
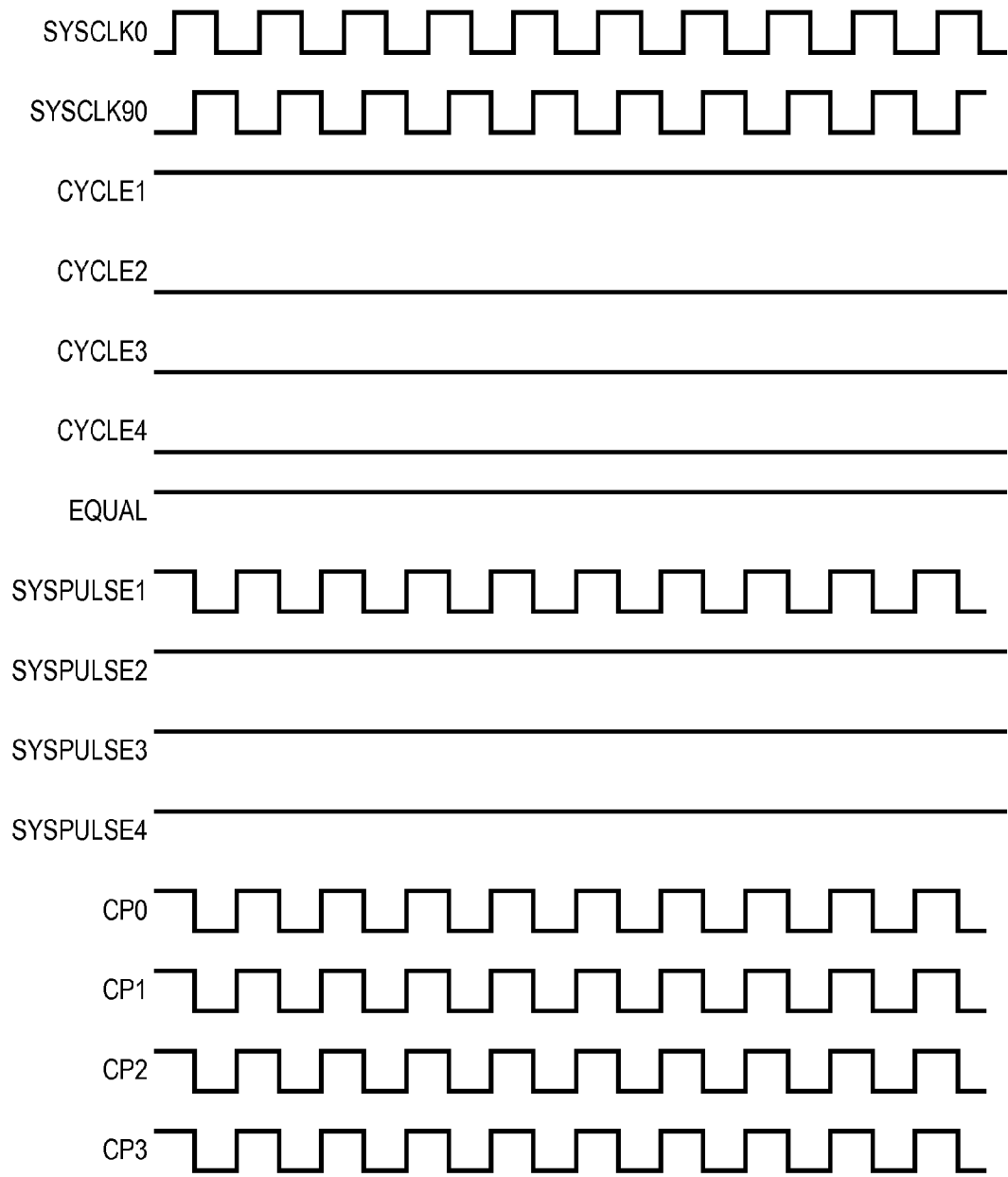

Assume now that the DRAM memory 232 has a word width of 16 bits, and is to operate as a read data port. During field programming, the memory cells 451 are set so that the signal PIN_COUNT has a value of 16, and so that the signal RDWRB is a logic high. The signal MAX1 from the decode circuit 453 will always be a logic high, and the signals MAX2 and MAX4 will each always be a logic low. The signal MAX CYCLES from the decode circuit 453 will have a value of "00". When the counter 456 is in its initial "00" state, the compare circuit 461 will determine that its two inputs are equal, and will actuate the EQUAL signal at its output. Consequently, the load enable input of the counter 456 will always be enabled, and on every clock the counter 456 will be loaded with the value "00" from its data input. As a result, the counter never has a chance to count, and never leaves its initial state of "00". Therefore, the output signal PIN CYCLES from the counter will always be "00". As a result, the signal CYCLE1 from the decode circuit 464 will be a continuous logic high, and the signals CYCLE2, CYCLE3 and CYCLE4 from the decode circuit 464 will each be a continuous logic low. The signal SYSPULSE1 will be equivalent to the system clock SYSCLK90, and the signals SYSPULSE2, SYSPULSE3 and SYSPULSE4 will each be a continuous logic high. The selector sections 481A, 481B and 481C will each be continuously selecting the "16" input thereof, and thus the signals CP0, CP1, CP2 and CP3 will each be identically the same as the signal SYSPULSE1. FIG. 10 is a timing diagram showing various signals that occur within the control circuit 411 during operation with this configuration.

Figure 11:
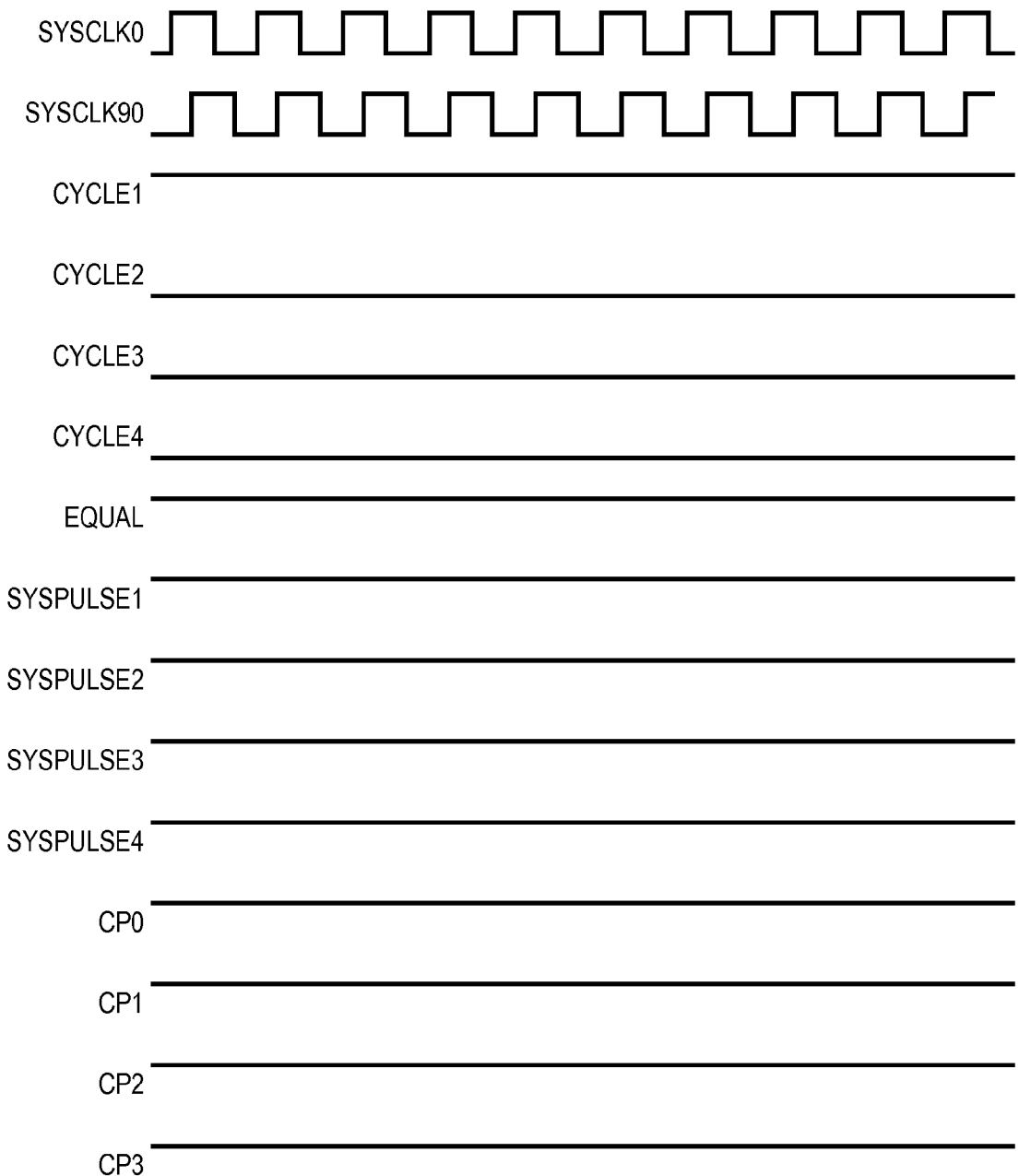

Assume now that the DRAM memory 232 has a word width of 16 bits, but that the data port 248 is configured to be a write data port rather than a read data port. In other words, the signal PIN_COUNT from the memory cells 451 will have the value 16, and the signal RDWRB will be a logic low, and will disable each of the NAND gates 471-474. As a result, the signals SYSPULSE1, SYSPULSE2, SYSPULSE3, SYSPULSE4, CP0, CP1, CP2 and CP3 will each be a continuous logic high. FIG. 11 is a timing diagram showing various signals that occur within the control circuit 411 during operation with this configuration.

Figure 12:
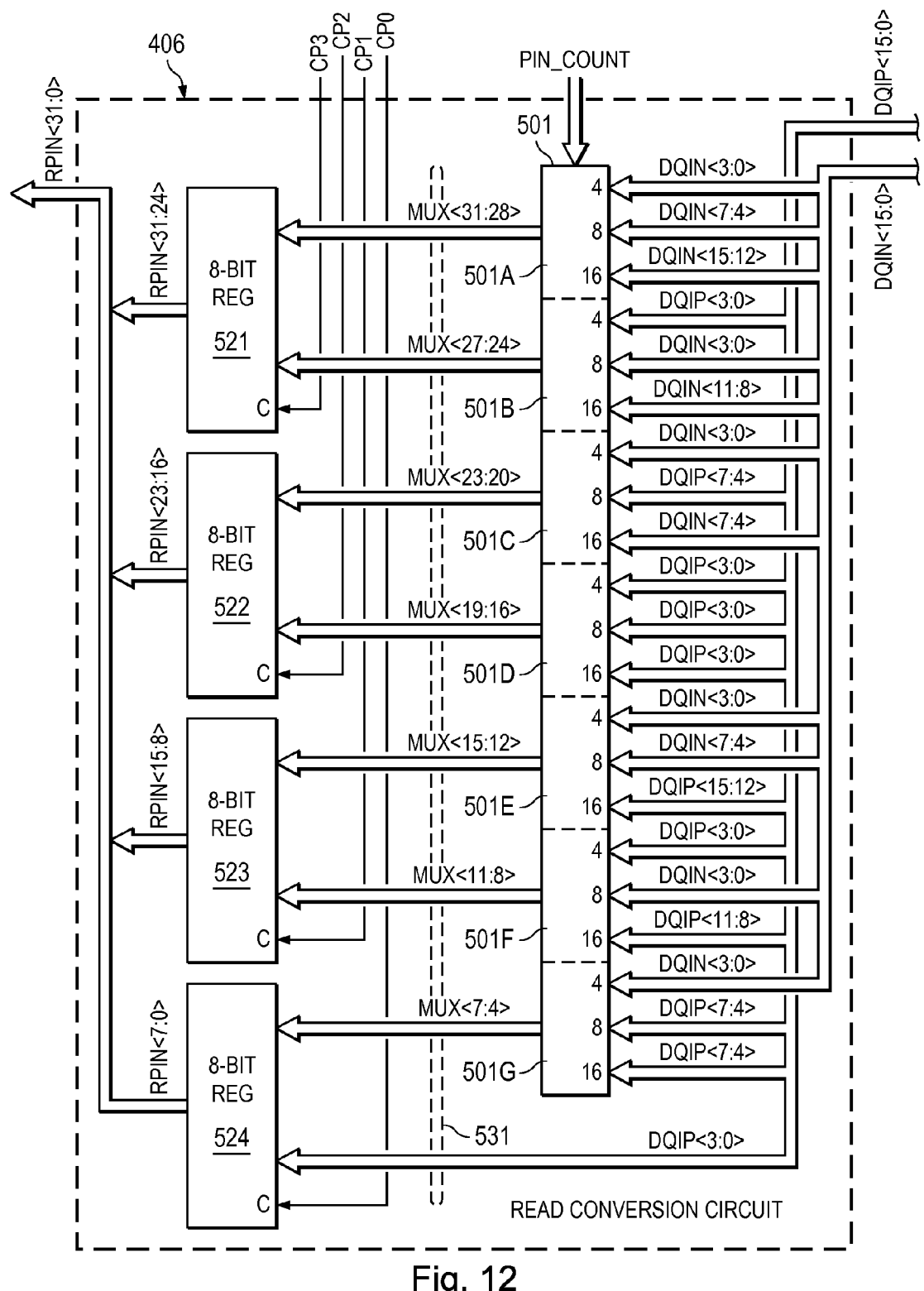
FIG. 12 is a block diagram showing in greater detail a read conversion circuit that is part of the data port of FIG. 4.

FIG. 12 is a block diagram showing in greater detail the read conversion circuit 406 of FIG. 4. The read conversion circuit 406 includes a selector 501 having seven sections 501A, 501B, 501C, 501D, 501E, 501F and 501G that each function as a three-to-one selector. The selector 501 is controlled by the signal PIN_COUNT that specifies the memory word width, and the seven sections of the selector each have three inputs "4", "8" and "16" that correspond to the respective possible memory word widths of 4 bits, 8 bits and 16 bits in the disclosed embodiment.

The read conversion circuit 406 receives signals from the data converter 241 (FIG. 3) on 32 lines DQIP<15:0> and DQIN<15:0>. The "4" input of selector section 501A, the "8" input of selector section 501B, the "4" input of selector section 501C, the "4" input of selector section 501E, the "8" input of selector section 501F, and the "4" input of selector section 501G each receive the input signals DQIN<3:0>. The "8" input of selector section 501A, the "16" input of selector section 501C, and the "8" input of selector section 501E each receive the input signals DQIN<7:4>. The "16" input of selector section 501A receives the input signals DQIN<15:12>. The "4" input of selector section 501B, all three inputs of selector section 501D, and the "4" input of selector section 501F all receive the input signals DQIP<3:0>. The "16" input of selector section 501D receives the input signals DQIN<11:8>. The "8" input of selector section 501C and the "8" and "16" inputs of selector section 501G each receive the input signal DQIP<7:4>. The "16" input of selector section 501E receives the input signals DQIP<15:12>. The "16" input of selector section 501F receives the input signals DQIP<11:8>. The selector sections 501A through 501G produce respective outputs MUX<31:28>, MUX<27:24>, MUX<23:20>, MUX<19:16>, MUX<15:12>, MUX<11:8> and MUX<7:4>.

The read conversion circuit 406 includes four 8-bit registers 521, 522, 523 and 524, which are respectively clocked by the signals CP3, CP2, CP1 and CP0 from the control circuit 411. The data inputs of the register 521 are coupled to the signals MUX<31:28> and MUX<27:24> from the outputs of selector sections 501A and 501B. The data inputs of the register 522 are coupled to the signals MUX<23:20> and MUX<19:16> from the outputs of selector sections 501C and 501D. The data inputs of the register 523 are coupled to the signals MUX<15:12> and MUX<11:8> from the outputs of selector sections 501E and 501F. The inputs to the register 524 are coupled to the signals MUX<7:4> from the output of selector section 501G, and to the input signals DQIP<3:0>. The registers 521, 522, 523 and 524 produce respective output signals on lines RPIN<31:24>, RPIN<23:16>, RPIN<15:8> and RPIN<7:0>, which are all supplied to the FIFO 401 (FIG. 4). The lines DQIP<15:0> and DQIN<15:0> represent an input interface, lines MUX<31:28>, MUX<27:24>, MUX<23:20>, MUX<19:16>, MUX<15:12>, MUX<11:8>, MUX<7:4> and DQIP<3:0> represent an intermediate interface 531, and lines RPIN<31:0> represent an output interface. The registers 521-524 are effectively 8-bit register segments that collectively define a 32-bit register.

The operation of the read conversion circuit 406 of FIG. 12 will now be described, including a separate discussion for each of the three possible memory word widths of 4, 8 and 16 bits. First, assume that the DRAM memory 232 has a word width of 4 bits, such that the signal PIN_COUNT has a value of 4, and causes each of these seven selector sections 501A-501G to continuously select the "4" input thereof. Although the read conversion circuit 406 has 16 input lines at DQIP<15:0>, and another 16 input lines at DQIN<15:0>, when the memory has a word width of 4 bits, the data converter 241 provides data on only a subset of these lines. The control circuit 411 will be generating control signals as shown in the timing diagram of FIG. 6.

In more detail, during a first time slot, the data converter 241 provides an 8-bit segment of data on lines DQIP<3:0> and DQIN<3:0>. The selector section 501G is selecting its "4" input, and supplies the 4 bits on lines DQIN<3:0> to its output. A clock occurs on line CP0, thereby clocking into register 524 the first 8 bits of data from the data converter 241. Then, during a second time slot, the data converter 241 provides another 8-bit segment of data on the same input lines (DQIP<3:0> and DQIN<3:0>). The selector sections 501E and 501F supply these 8 bits to the input of register of 523, where they are clocked into register 523 by a pulse on line CP1. Next, during a third time slot, the data converter 241 provides another 8-bit segment of data on lines DQIP<3:0> and DQIN<3:0>. The selector sections 501C and 501D supply these 8 bits to the inputs of register 522, where they are clocked into that register by a pulse on line CP2. Then, during a fourth time slot, the data converter 241 provides yet another 8-bit segment of data on lines DQIP<3:0> and DQIN<3:0>. The selector sections 501A and 501B supply these 8 bits to the inputs of register 521, where they are clocked into that register by a pulse on line CP3. Thus, during each of the four time slots, an 8-bit data segment from the input lines is supplied to a respective one of four different groups of the lines in interface 531. After the fourth time slot, the 32 bits loaded into the registers 521-524 can be accepted in parallel by the FIFO 401 across the 32-bit bus RPIN<31:0>.

Now assume that, instead of a word width of 4 bits, the DRAM memory 232 has a word width of 8 bits. The signal PIN_COUNT will have a value of 8, and will be causing each of the selector sections 501A-501G to be continuously selecting the "8" input thereof. The control circuit 411 will be generating control signals as shown in the timing diagram of FIG. 8. The data converter circuit will use a different subset of the input lines, and in particular will use lines DQIP<7:0> and DQIN<7:0>. During a first time slot, the data converter 241 will provide a 16-bit segment of data on the lines DQIP<7:4> and DQIN<7:0>. The selector sections 501E and 501F will supply the signals DQIN<7:0> to the input of register 523. At the same time, the selector section 501G will supply the signals DQIP<7:4> to the input of register 524, and the input signals DQIP<3:0> will be directly present at other inputs of the register 524. The registers 523 and 524 will simultaneously receive pulses on lines CP0 and CP1, thereby loading into these two registers the 16 bits of data present at their inputs. Then, during a second time slot, the data converter 241 will supply another 16-bit segment of data on lines DQIP<7:0> and DQIN<7:0>. The selector sections 501A and 501B will supply signals DQIN<7:0> to the inputs of register 521, and the selector sections 501C and 501D will supply signals DQIP<7:0> to the inputs of register 522. The registers 521 and 522 will be simultaneously loaded by pulses on lines CP2 and CP3. Thus, during each of the two time slots, a 16-bit data segment from the input lines is supplied to a respective one of two different groups of the lines in interface 531. After the second time slot, the 32 bits loaded into the registers 521-524 can be accepted in parallel by the FIFO 401 across the 32-bit bus RPIN<31:0>.

Now assume that, instead of a word width of 4 or 8 bits, the DRAM memory 232 has a word width of 16 bits. The signal PIN_COUNT will have a value of 16, and will be causing each of the selector sections 501A-501G to continuously select the "16" input thereof. The control circuit 411 will be generating control signals as shown in the timing diagram of FIG. 10. The data converter 241 will supply a 32-bit segment of data on all 32 of the lines DQIP<15:0> and DQIN<15:0>. The selector sections 501A and 501B will supply the signals DQIN<15:8> to the inputs of register 521, the selector sections 501C and 501D will supply the signals DQIN<7:0> to the inputs of register 522, the selector sections 501E and 501F will supply the signals DQIP<15:8> to the inputs of register 523, the selector section 501G will supply the signals DQIP<7:4> to inputs of register 524, and the signals DQIP<3:0> will be applied directly to other inputs of 524. The four registers 521-524 will all be clocked simultaneously by simultaneous pulses on the lines CP0, CP1, CP2 and CP3. Thus, during a single time slot, a 32-bit data segment from the input lines is supplied to a single group of 32 lines in the interface 531. After that single time slot, the 32 bits loaded into the registers 521-524 can be accepted in parallel by the FIFO 401 across the 32-bit bus RPIN<31:0>. It will be noted that, when the memory word width is respectively 4 bits, 8 bits or 16 bits, the read conversion circuit effectively treats the overall 32-bit register defined by register segments 521-524 as having (1) four 8-bit sections 521, 522, 523 and 524, (2) two 16-bit sections 521-522 and 523-524, or (3) a single 32-bit section 521-524.

Figure 13:
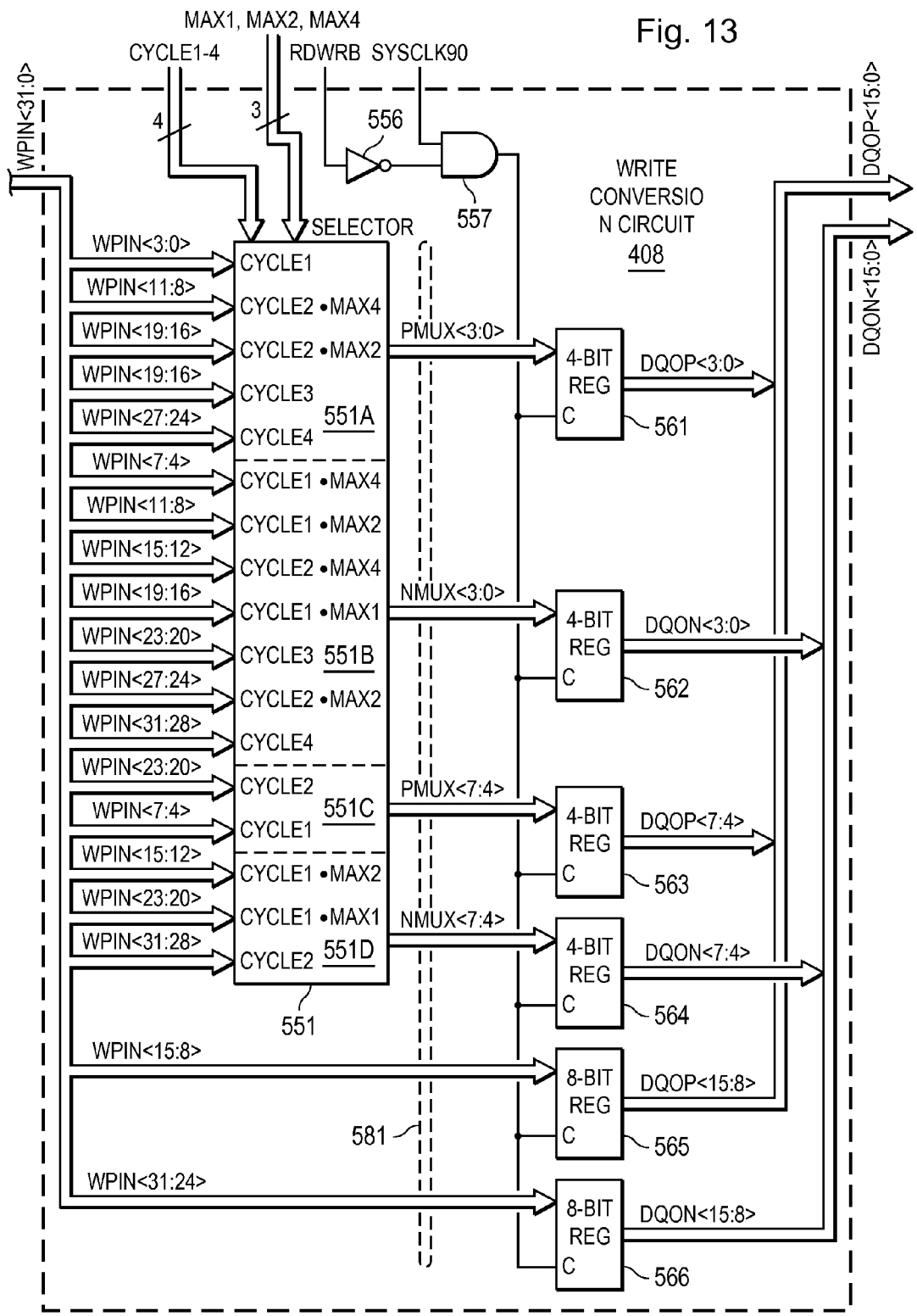
FIG. 13 is a block diagram showing in greater detail a write read conversion circuit that is part of the data port of FIG. 4.

FIG. 13 is a block diagram showing in greater detail the write conversion circuit 408 of FIG. 4. The write conversion circuit 408 includes a selector 551 that is controlled by the signals CYCLE1, CYCLE2, CYCLE3, CYCLE4, MAX1, MAX2 and MAX4 from the control circuit 411 (FIG. 5). The selector 551 includes four sections 551A, 551B, 551C and 551D. The selector section 551A functions as a five-to-one selector, the selection section 551B functions as a seven-to-one selector, the selector section 551C functions as two-to-one selector, and the selector section 551D functions as a three-to-one selector. Each input to each selector section is selected either (1) by one of the control signals supplied to the selector, or (2) by a combination of two of the control signals supplied to the selector. In this regard, for example, if a selector input is labeled "CYCLE2·MAX4", it means that particular input is selected when the two signals CYCLE2 and MAX 4 are both a logic high. Only one input of each selector section is selected at any given point in time.

The write conversion circuit 408 receives 32 input lines WPIN<31:0> from the FIFO 401 (FIG. 4). The selector section 551A has an input CYCLE1 that is coupled to input lines WPIN<3:0>, an input CYCLE2·MAX4 that is coupled to input lines WPIN<11:8>, an input CYCLE2·MAX2 that is coupled to input lines WPIN<19:16>, an input CYCLE3 that is coupled to input lines WPIN<19:16>, and an input CYCLE4 that is coupled to input lines WPIN<27:24>. The selector section 551B has an input CYCLE1·MAX4 that is coupled to input lines WPIN<7:4>, an input CYCLE1·MAX2 that is coupled to input lines WPIN<11:8>, an input CYCLE2·MAX4 that is coupled to input lines WPIN<15:12>, an input CYCLE1·MAX1 that is coupled to input lines WPIN<19:16>, an input CYCLE3 that is coupled to input lines WPIN<23:20>, an input CYCLE2·MAX2 that is coupled to input lines WPIN<27:24>, and an input CYCLE4 that coupled to input lines WPIN<31:28>. The selector section 551C has an input CYCLE2 that is coupled to input lines WPIN<23:20>, and an input CYCLE1 that is coupled to input lines WPIN<7:4>. The selector section 551D has an input CYCLE1·MAX2 that is coupled to input lines WPIN<15:12>, an input CYCLE1·MAX1 that is coupled to input lines WPIN<23:20>, and an input CYCLE2 that is coupled to input lines WPIN<31:28>. The selector sections 551A, 551B, 551C and 551D produce respective outputs PMUX<3:0>, NMUX<3:0>, PMUX<7:4> and NMUX<7:4>.

The write conversion circuit 408 includes an inverter 556 having an input coupled to the signal RDWRB, and includes an AND gate 557 having one input coupled to the output of inverter 556, and another input coupled to the system clock signal SYSCLK90. The write conversion circuit 408 also includes four 4-bit registers 561, 562, 563 and 564, and two 8-bit registers 565 and 566. The registers 561-566 each have a clock input coupled to the output of the AND gate 557. The data inputs of register 561 are coupled to the signals PMUX<3:0> from the selector section 551A, the data inputs of register 562 are coupled to the signals NMUX<3:0> from selector section 551B, the data inputs of register 563 are coupled to the signals PMUX<7:4> from selector section 551C, and the data inputs of register 564 are coupled to the signals NMUX<7:4> from selector section 551D. The data inputs of register 565 are coupled to input signals WPIN<15:8>, and the data inputs of register 566 are coupled to input signals WPIN<31:24>. The registers 561-566 collectively hold 32 bits of data, and the outputs of these registers are supplied to the data converter 241 on 32 lines DQOP<15:0> and DQON<15:0>. The input lines WPIN<31:0> serve as an input interface, and the lines DQOP<15:0> and DQON<15:0> serve as an output interface. The lines PMUX<3:0>, NMUX<3:0>, PMUX<7:4>, NMUX<7:4>, WPIN<15:8> and WPIN<31:24> serve as an intermediate interface 581 within the write conversion circuit 408.

The operation of the write conversion circuit 408 will now be described, including a separate discussion for each of the permissible memory word widths in the disclosed embodiment. If the data port 248 is configured to be a read data port, the signal RDWRB will be a logic high, and the output of inverter 556 will be a logic low, thereby forcing the output of the AND gate 557 to be a continuous logic low. As a result, the registers 561-566 will not be clocked, and thus the write conversion circuit 408 is effectively disabled. On the other hand, if the data port 248 is configured to be a write data port, then the signal RDWRB will be a logic low, and the output of inverter 556 will be a logic high, thereby permitting the system clock signal SYSCLK90 to pass through the AND gate 557 without change and to be applied to the clock inputs of each of the registers 561-566.

Assume first that the memory has a word width of 4 bits. The control signals supplied to the selector 551 by the control circuit 411 of FIG. 5 will be as shown in the timing diagram of FIG. 7. A conversion operation will involve four successive time slots, during which the FIFO 401 will be continuously presenting the same 32 bits of data on the input lines WPIN<31:0>. Although there are 32 output lines DQOP<15:0> and DQON<15:0>, when the memory width is 4 bits, the data converter 241 will be accepting data on only a subset of these lines, which are lines DQOP<3:0> and DQON<3:0>. As discussed earlier, when the memory width is 4 bits, the signal MAX4 will be a continuous logic high, and the signals MAX1 and MAX2 will each be a continuous logic low. During the first time slot, the signal CYCLE1 will be a logic high. The input lines WPIN<3:0> will be supplied from the CYCLE1 input of selector section 551A to the register 561, and the input lines WPIN<7:4> will be supplied from the CYCLE1·MAX4 input of selector section 551B to the register 562. This 8-bit data segment will be clocked into the registers 561 and 562, and supplied across lines DQOP<3:0> and DQON<3:0> to the data converter 241. Selector sections 551C-551D and registers 563-566 are not relevant, because they relate to output lines that the data converter 241 is currently ignoring.

During the second time slot, the signal CYCLE2 is high. The input signals WPIN<11:8> at the CYCLE2·MAX4 input of selector section 551A are supplied to the register 561, and the input signals WPIN<15:12> at the input CYCLE2·MAX4 of selector section 551B are supplied to the register 562. This 8-bit data segment is then clocked into the registers 561 and 562, and supplied to the data converter 241.

During the third time slot, the signal CYCLE3 is a logic high. The input signals WPIN<19:16> at the CYCLE3 input of selector section 551A are supplied to the register 561, and the input signals WPIN<23:20> at the CYCLE3 input of selector section 551B are supplied to the register 562. This 8-bit data segment is then clocked into the registers 561 and 562, and supplied to the data converter 241.

During the fourth time slot, the signal CYCLE4 is high. The input signals WPIN<27:24> at the CYCLE4 input of selector section 551A are supplied to the register 561, and the inputs WPIN<31:28> at the CYCLE4 input to selector section 551B are supplied to the register 562. This 8-bit data segment is clocked into the registers 561 and 562, and supplied to the data converter 241. Thus, during these four time slots, all 32 bits on input lines WPIN<31:0> are supplied to the data converter 241 in four groups of 8 bits each. It will be noted that, during each of the four time slots, an 8-bit data segment from a respective different group of eight of the input lines WPIN<31:0> is selected and supplied to the data converter 241.

Assume now that, instead of a word width of 4 bits, the DRAM memory 232 has a word width of 8 bits. As discussed earlier, the signal MAX2 will be a continuous logic high, and the signals MAX1 and MAX4 will each be a continuous logic low. The data converter 241 will be accepting data on a subset of the output lines, which are lines DQOP<7:0> and DQON<7:0>. The data conversion will involve two successive time slots. The timing diagram of FIG. 9 shows signals that the write conversion circuit 408 receives from the control circuit 411 of FIG. 5 in this operational configuration.

During the first time slot, the signal CYCLE1 is a logic high. The signals from input lines WPIN<3:0> at the CYCLE1 input of selector section 551A will be supplied to the inputs of register 561, the signals on input lines WPIN<11:8> at the CYCLE1·MAX2 of selector section 551B will be supplied to the inputs of register 562, the signals on input lines WPIN<7:4> at the CYCLE1 input of selector section 551C will be supplied to the inputs of register 563, and the signals on input lines WPIN<15:12> at the CYCLE1·MAX2 input of selector section 551D will be supplied to the inputs of register 564. This 16-bit data segment will be clocked into the registers 561, 562, 563 and 564, and then supplied to the data converter 241 on lines DQOP<7:0> and DQON<15:0>. The registers 565 and 566 are not relevant, because the data converter 241 is ignoring their outputs.

In the second time slot, the signal CYCLE2 will be a continuous logic high. The signals on input lines WPIN<19:16> at the CYCLE2·MAX2 input of selector section 551A will be supplied to the inputs of register of 561, the signals on input lines WPIN<27:24> at the CYCLE2·MAX2 input of selector section 551B will be supplied to the inputs of register 562, the signals on input lines WPIN<23:20> at the CYCLE2 input of selector section 551C will be supplied to the inputs of register 563, and the signals on input lines WPIN<31:28> at the CYCLE2 input of selector section 551D will be supplied to the inputs of register 564. This 16-bit data segment will be clocked into the registers 561-564, and then supplied to the data converter 241. Thus, in two successive time slots, all 32 bits on the input lines WPIN<31:0> are supplied to the data converter 241. It will be noted that, during each of the two time slots, a 16-bit data segment from a respective different group of 16 of the input lines WPIN<31:0> is selected and supplied to the data converter 241.

Assume now that, instead of a word width of 4 or 8 bits, the DRAM memory 232 instead has a word width of 16 bits. As discussed earlier, the signal MAX1 will be a continuous logic high, and the signals MAX2 and MAX4 will each be a continuous logic low. The signal CYCLE1 will be a continuous logic high, and the signals CYCLE2, CYCLE3 and CYCLE4 will each be a continuous logic low. The timing diagram of FIG. 11 shows signals provided to the write conversion circuit 408 by the control circuit 411 in this configuration. A single time slot is used to transfer all 32 bits from the input lines WPIN<31:0> to the 32 output lines DQOP<15:0> and DQON<15:0>. During this single time slot, the signals on input lines WPIN<3:0> at the CYCLE1 input of the selector section 551A are supplied to the inputs of register 561, the signals on input lines WPIN<19:16> at the CYCLE1·MAX1 input of selector section 551B are supplied to the inputs of register 562, the signals on input lines WPIN<7:4> at the CYCLE1 input of selector section 551C are supplied to the inputs of register 563, the signals on input lines WPIN<23:20> at the CYCLE1·MAX1 input of selector section 551D are supplied to the inputs of register 564, the signals on input lines WPIN<15:8> are supplied directly to the inputs of register 565, and the signals on input lines WPIN<31:24> are supplied directly to the inputs of register 566. This 32-bit data segment is clocked simultaneously into all of the registers 561-566, and then supplied to the data converter 241. It will be noted that, during the single time slot, a 32-bit data segment from the entire group of all 32 input lines WPIN<31:0> is supplied to the data converter 241.

Although a selected embodiment has been illustrated and described in detail, it should be understood that substitutions and alterations are possible without departing from the spirit and scope of the present invention, as defined by the claims that follow.

What is claimed is:

1. An apparatus comprising a circuit that includes:
  configuration identification structure configurable to identify a selected one of a plurality of different configurations each having associated therewith a respective one of a plurality of different integer numbers that are each greater than zero, the integer number associated with the selected configuration being a selected integer number;

a first interface;

a second interface that includes a plurality of lines, the number of the lines being greater than or equal to the largest integer number in the plurality of integer numbers; and a conversion section that is coupled to the first and second interfaces, and that is responsive to the configuration identification structure, the conversion section organizing the lines of the second interface into line groups equal in number to the selected integer number, the conversion section carrying out a conversion operation in which it supplies to each line group a respective incoming data segment received through the first interface, wherein if the selected integer value is greater than one then the line groups are mutually exclusive and, during the conversion operation, a plurality of the incoming data segments equal in number to the selected number are successively received through the first interface and are successively supplied to the respective line groups.

2. An apparatus according to claim 1,
wherein the first interface includes a plurality of lines; and
wherein the conversion section includes a plurality of selector sections, each selector section being controlled by the configuration identification structure, having an output, and having a plurality of inputs that are each coupled to a subset of the lines of the first interface, the outputs of the selector sections being supplied to lines of the second interface.

3. An apparatus according to claim 1,
including a third interface having a plurality of lines;
wherein the conversion section includes a register having inputs coupled to the lines of the second interface, and having outputs coupled to the lines of the third interface, the conversion section viewing the register as having sections equal in number to the selected integer number, each data segment received through the first interface being loaded into a respective register section, wherein if the selected integer value is greater than one then during the conversion operation the incoming data segments are loaded successively into the respective register sections.

4. An apparatus according to claim 3,
wherein the register includes a plurality of segments equal in number to the selected integer number; and
including a control section that generates a plurality of control signals as a function of the selected configuration identified by the configuration identification section, and that supplies to each register segment a respective one of the control signals.

5. An apparatus according to claim 4, wherein the control section generates a plurality of intermediate signals, and includes a signal selector that is responsive to the configuration identification section, that has inputs responsive to the intermediate signals, and that has outputs each carrying a respective one of the control signals, the signal selector supplying the intermediate signals selectively to its outputs in dependence on the selected configuration identified by the configuration identification section.

6. An apparatus comprising a circuit that includes:
configuration identification structure configurable to identify a selected one of a plurality of different configurations each having associated therewith a respective one of a plurality of different integer numbers that are each greater than zero, the integer number associated with the selected configuration being a selected integer number;

a first interface that includes a plurality of lines, the number of the lines being greater than or equal to the largest integer number in the plurality of integer numbers;

a second interface; and a conversion section that is coupled to the first and second interfaces, and that is responsive to the configuration identification structure, the conversion section organizing the lines of the first interface into line groups equal in number to the selected integer number, the conversion section carrying out a conversion operation in which it supplies to the second interface a respective incoming data segment from each line group, wherein if the selected integer value is greater than one then the line groups are mutually exclusive and, during the conversion operation, the incoming data segments from the respective line groups are supplied successively to the second interface.

7. An apparatus according to claim 6,
wherein the second interface includes a plurality of lines;
wherein the conversion section includes a plurality of selector sections, each selector section having a plurality of inputs that are each coupled to a subset of the lines of the first interface, and having an output, the outputs of the selector sections being supplied to lines of the second interface; and
including a control section that is responsive to the configuration identification structure and that generates select signals for the selector sections as a function of the selected configuration.

8. An apparatus according to claim 6,
including a third interface having a plurality of lines; and
wherein the conversion section includes a register having inputs coupled to the lines of the second interface, and having outputs coupled to the lines of the third interface, each data segment received through the first interface being loaded into the register, wherein if the selected integer value is greater than one then during the conversion operation the incoming data segments are successively loaded into a section of the register.

9. An apparatus according to claim 8,
wherein the second interface includes a plurality of lines;
wherein the conversion section includes a plurality of selector sections, each selector section having a plurality of inputs that are each coupled to a subset of the lines of the first interface, and having an output, the outputs of the selector sections being supplied to lines of the second interface;
including a control section that is responsive to the configuration identification structure and that generates select signals for the selector sections as a function of the selected configuration; and
wherein the select signals generated by the control section include a plurality of control signals that are equal in number to the largest integer number in the plurality of integer numbers, and that are selectively controlled in a manner dependent on the selected configuration.

10. An apparatus according to claim 9, wherein the control section includes a counter that carries out a cyclic count sequence dependent on the selected configuration, and includes a decode circuit having inputs coupled to the outputs of the counter, and having outputs that carry decode signals each serving as a respective one of the control signals.

11. A method involving a circuit having configuration identification structure, a first interface, and a second interface that includes a plurality of lines, the number of the lines being greater than or equal to the largest integer number in the plurality of integer numbers, the method comprising:

configuring the configuration identification structure to identify a selected one of a plurality of different configurations each having associated therewith a respective one of a plurality of different integer numbers that are each greater than zero, the integer number associated with the selected configuration being a selected integer number;

organizing the lines of the second interface into line groups equal in number to the selected integer number; and carrying out a conversion operation in which each line group is supplied with a respective incoming data segment received through the first interface, wherein if the selected integer value is greater than one then the line groups are mutually exclusive and, during the conversion operation, a plurality of the incoming data segments equal in number to the selected number are successively received through the first interface and are successively supplied to the respective line groups.

12. A method according to claim 11, wherein the first interface includes a plurality of lines;

wherein the conversion section includes a plurality of selector sections each having an output, and having a plurality of inputs that are each coupled to a subset of the lines of the first interface, the outputs of the selector sections being supplied to lines of the second interface; and controlling the selector sections as a function of the selected configuration identified by the configuration identification structure.

13. A method according to claim 11, including a third interface having a plurality of lines, and a register having inputs coupled to the lines of the second interface, and having outputs coupled to the lines of the third interface;

including viewing the register as having sections equal in number to the selected integer number; and including loading each data segment received through the first interface into a respective register section, wherein if the selected integer value is greater than one then during the conversion operation the incoming data segments are loaded successively into the respective register sections.

14. A method according to claim 13, wherein the register includes a plurality of segments equal in number to the selected integer number;

including generating a plurality of control signals as a function of the selected configuration identified by the configuration identification section; and including supplying to each register segment a respective one of the control signals.

15. A method according to claim 14, including generating a plurality of intermediate signals;

including a signal selector that has inputs responsive to the intermediate signals, and that has outputs each carrying a respective one of the control signals; and causing the signal selector to selectively supply to its outputs intermediate signals selected in dependence on the selected configuration identified by the configuration identification section.

16. A method involving a circuit having configuration identification structure, having a first interface that includes a plurality of lines, the number of the lines being greater than or equal to the largest integer number in the plurality of integer numbers, and having a second interface, the method comprising:

configuring the configuration identification structure to identify a selected one of a plurality of different configurations each having associated therewith a respective one of a plurality of different integer numbers that are each greater than zero, the integer number associated with the selected configuration being a selected integer number;

organizing the lines of the first interface into line groups equal in number to the selected integer number; and carrying out a conversion operation that includes supplying to the second interface a respective incoming data segment from each line group, wherein if the selected integer value is greater than one then the line groups are mutually exclusive and, during the conversion operation, the incoming data segments from the respective line groups are supplied successively to the second interface.

17. A method according to claim 16, wherein the second interface includes a plurality of lines;

including a plurality of selector sections, each selector section having a plurality of inputs that are each coupled to a subset of the lines of the first interface, and having an output, the outputs of the selector sections being supplied to lines of the second interface; and generating select signals that control the selector sections as a function of the selected configuration.

18. A method according to claim 16, including a third interface having a plurality of lines;

including a register having inputs coupled to the lines of the second interface, and having outputs coupled to the lines of the third interface; and loading into the register each data segment received through the first interface, wherein if the selected integer value is greater than one then the incoming data segments are successively loaded into one section of the register.

19. A method according to claim 18, wherein the second interface includes a plurality of lines;

including a plurality of selector sections, each selector section having a plurality of inputs that are each coupled to a subset of the lines of the first interface, and having an output, the outputs of the selector sections being supplied to lines of the second interface;

generating select signals that control the selector sections as a function of the selected configuration;

wherein the select signals include a plurality of control signals that are equal in number to the largest integer number in the plurality of integer numbers; and wherein the generating the control signals includes selectively controlling the select signals in a manner dependent on the selected configuration.

20. A method according to claim 19, including carrying out with a counter a cyclic count sequence that is dependent on the selected configuration; and carrying out the generating of the control signals in a manner that includes supplying outputs of the counter to inputs of a decode circuit, the control signals including signals from outputs of the decode circuit.

* * * * *